(12) United States Patent
Nishimura et al.

(10) Patent No.: US 7,148,965 B2
(45) Date of Patent: Dec. 12, 2006

(54) WAVELENGTH MONITOR, OPTICAL MODULE, AND OPTICAL MODULE PACKAGING METHOD

(75) Inventors: Yasunori Nishimura, Tokyo (JP); Shinichi Takagi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 280 days.

(21) Appl. No.: 10/477,113

(22) PCT Filed: Dec. 12, 2002

(86) PCT No.: PCT/JP02/13029

§ 371 (c)(1),
(2), (4) Date: Nov. 7, 2003

(87) PCT Pub. No.: WO03/056669

PCT Pub. Date: Jul. 10, 2003

(65) Prior Publication Data

US 2004/0136001 A1 Jul. 15, 2004

(30) Foreign Application Priority Data

Dec. 26, 2001 (JP) .............................. 2001-393589

(51) Int. Cl.
*H01S 5/22* (2006.01)
*H01S 5/687* (2006.01)
*G01N 21/27* (2006.01)
*G01J 3/51* (2006.01)

(52) U.S. Cl. ......................................... 356/416; 372/32

(58) Field of Classification Search ................ 356/416, 356/419; 359/892
See application file for complete search history.

(56) References Cited

U.S. PATENT DOCUMENTS

| 6,667,997 | B1* | 12/2003 | Nasu et al. .................... 372/32 |
| 6,674,968 | B1* | 1/2004 | Xie .............................. 398/79 |
| 6,788,717 | B1* | 9/2004 | Yokoyama ............... 372/29.01 |
| 6,867,918 | B1* | 3/2005 | Damask ...................... 359/497 |
| 2003/0157362 | A1* | 8/2003 | Suzuki et al. ............... 428/632 |

FOREIGN PATENT DOCUMENTS

JP 61-282808 12/1986

(Continued)

OTHER PUBLICATIONS

Unpublished U.S. Appl. No. 10/250,454, Masao Imaki, et al., "Wave plate, wavelength filter, and wavelength monitor", filed Dec. 12, 2003.

*Primary Examiner*—F. L. Evans
(74) *Attorney, Agent, or Firm*—Buchanan Ingersoll PC

(57) ABSTRACT

A wavelength filter is disposed between a laser diode and a photodiode that receives the rear-facet output light of the laser diode. Either a part on one side of an input or an output surface of the wavelength filter is bounded to a protrusion provided in a metal holder for holding the wavelength filter. As a result, a support structure is obtained that does not bring a damage on the wavelength filter caused by degradation of optical characteristics or temperature variation of the wavelength filter when support-fixing a wavelength filter having a complex refractive index crystal.

23 Claims, 12 Drawing Sheets

FOREIGN PATENT DOCUMENTS

| | | |
|---|---|---|
| JP | 1-238611 | 9/1989 |
| JP | 2000-56185 | 2/2000 |
| JP | 2001-94189 | 4/2001 |
| JP | 2001-244557 | 9/2001 |
| JP | 2001244557 A * | 9/2001 |
| JP | 2001-291928 | 10/2001 |
| JP | 2002-237651 | 8/2002 |
| WO | WO 03/038484 A1 | 5/2003 |

* cited by examiner

FIG.1
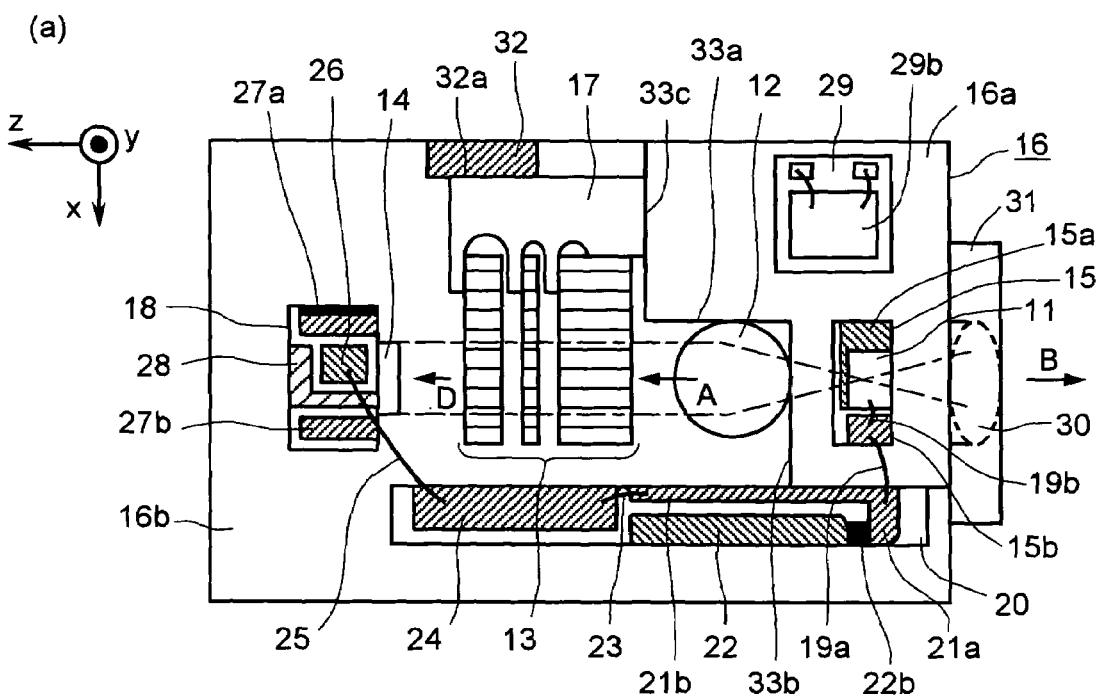
(a)
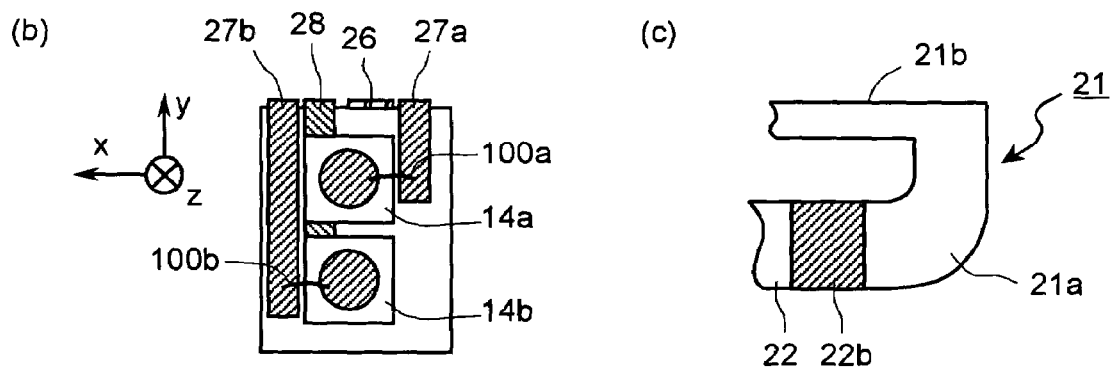
(b)   (c)
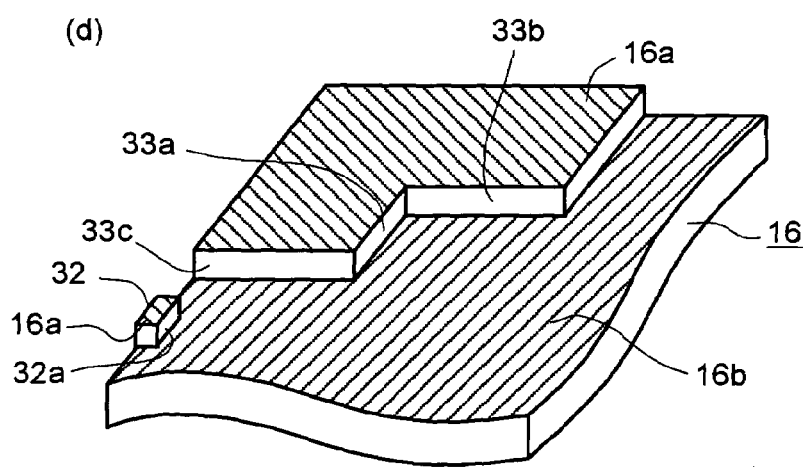
(d)

FIG. 2
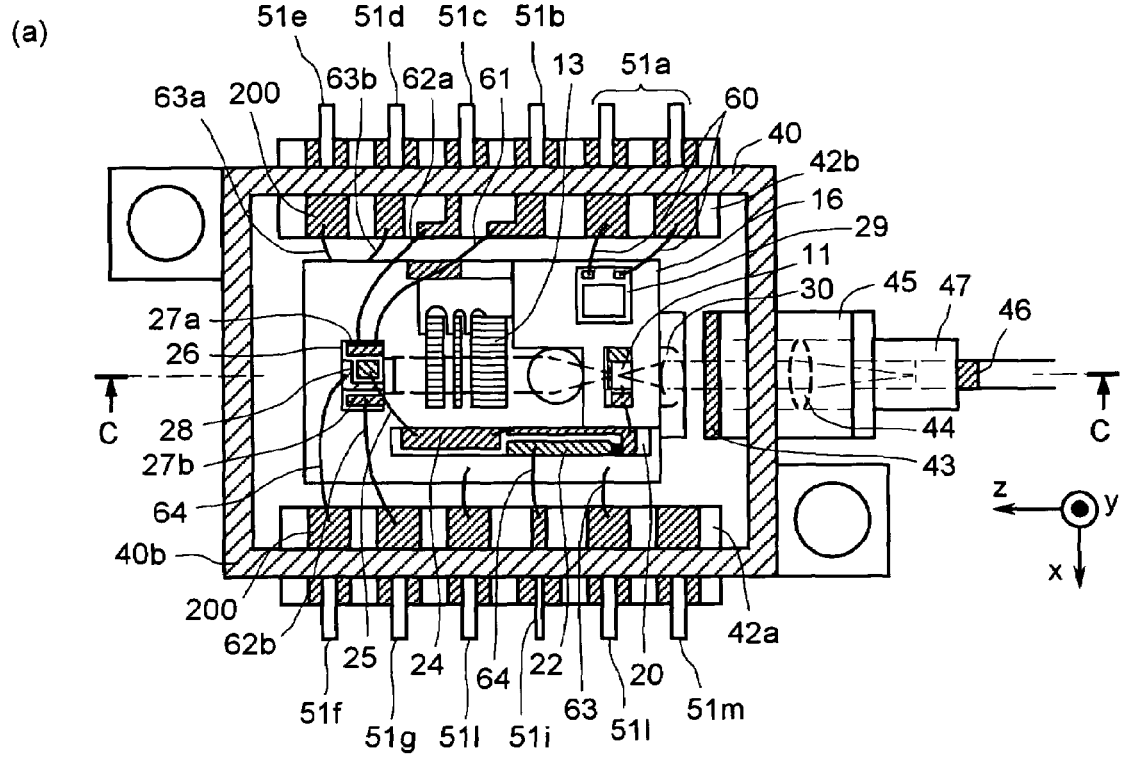
(a)
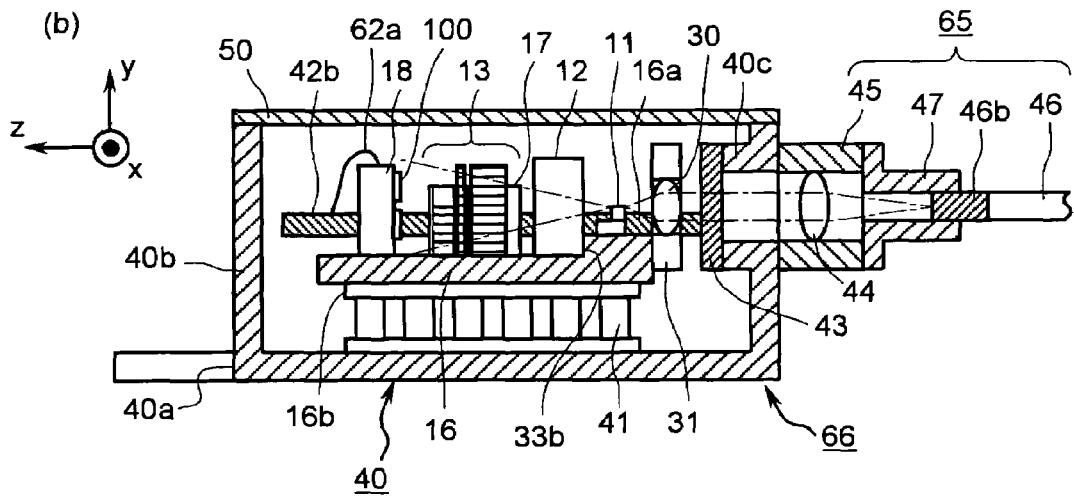
(b)
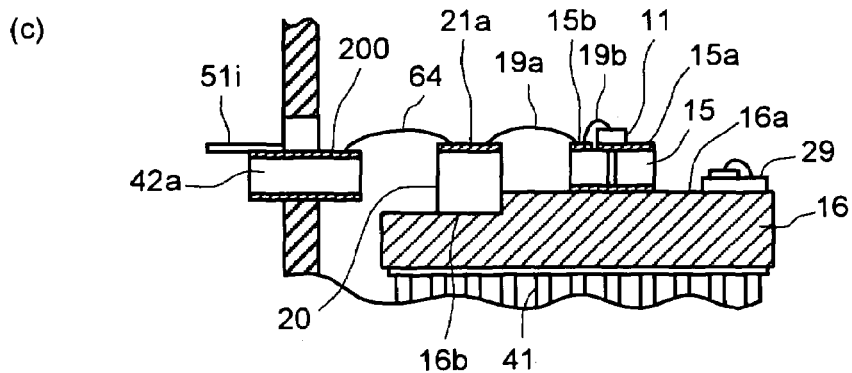
(c)

FIG.3
(a)
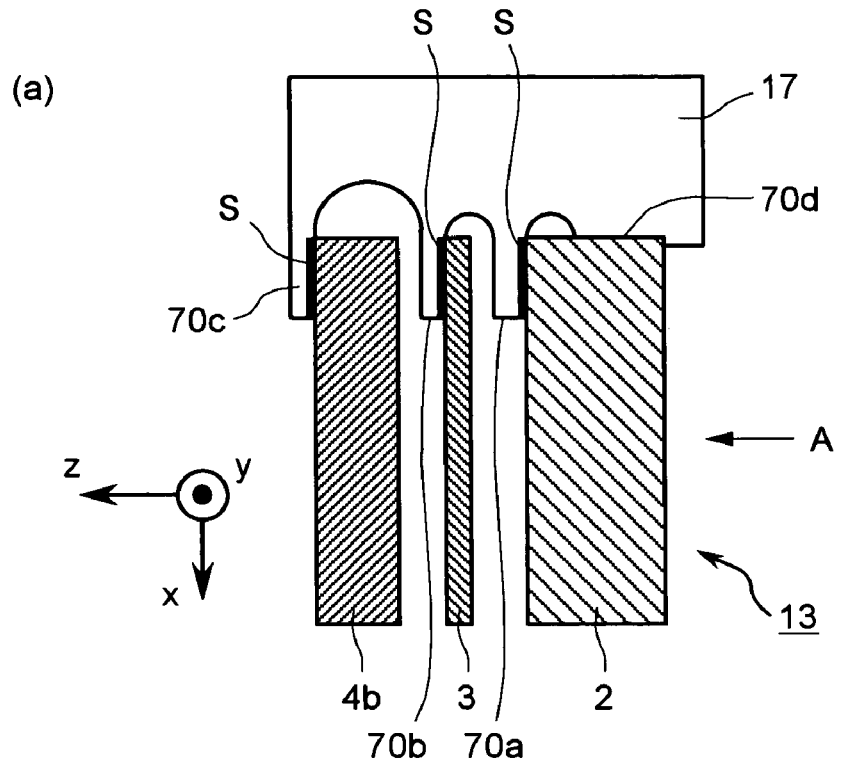
(b)
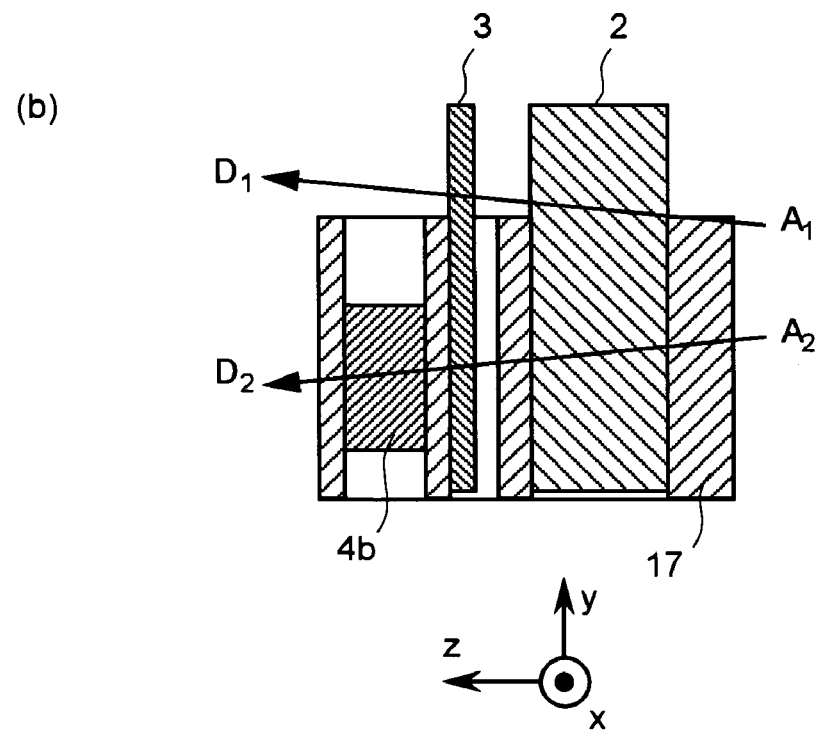

FIG.7
(a)
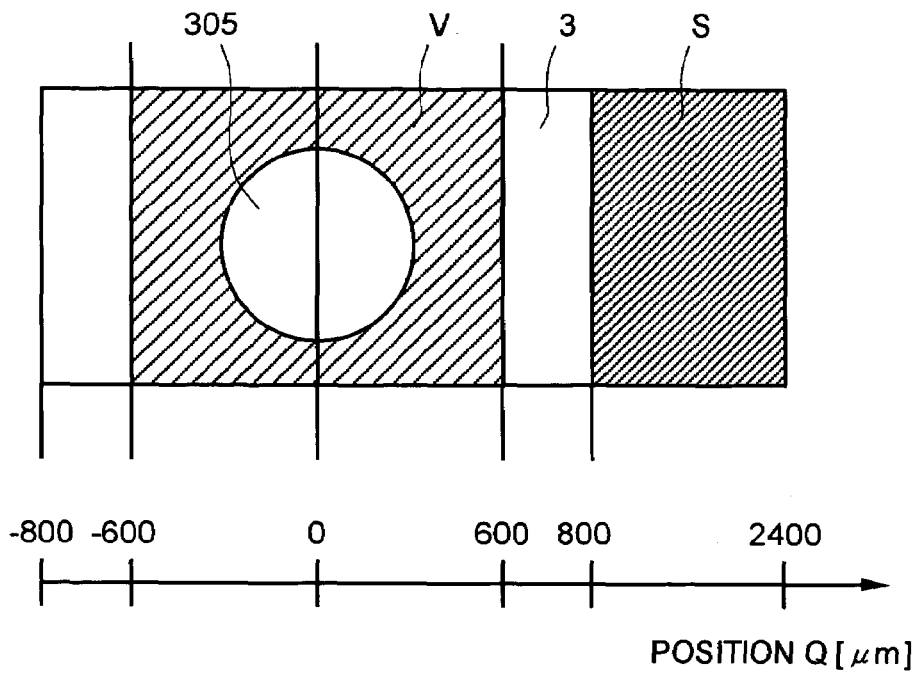
(b)
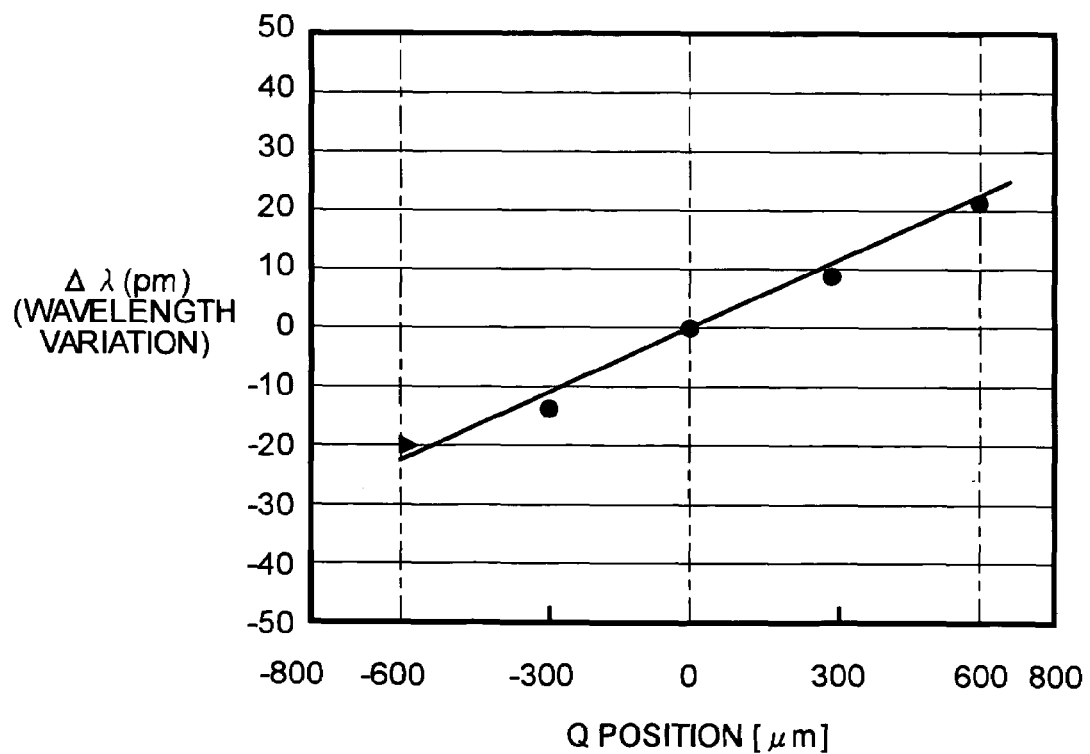

FIG. 11
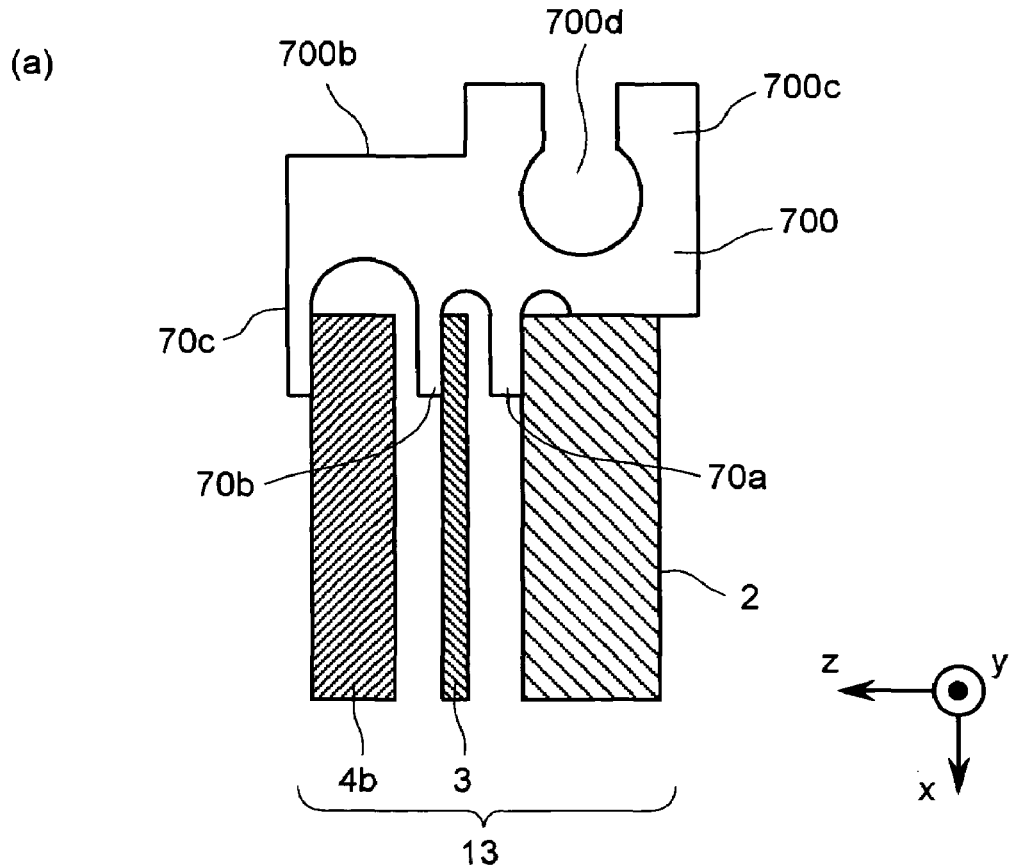
(a)
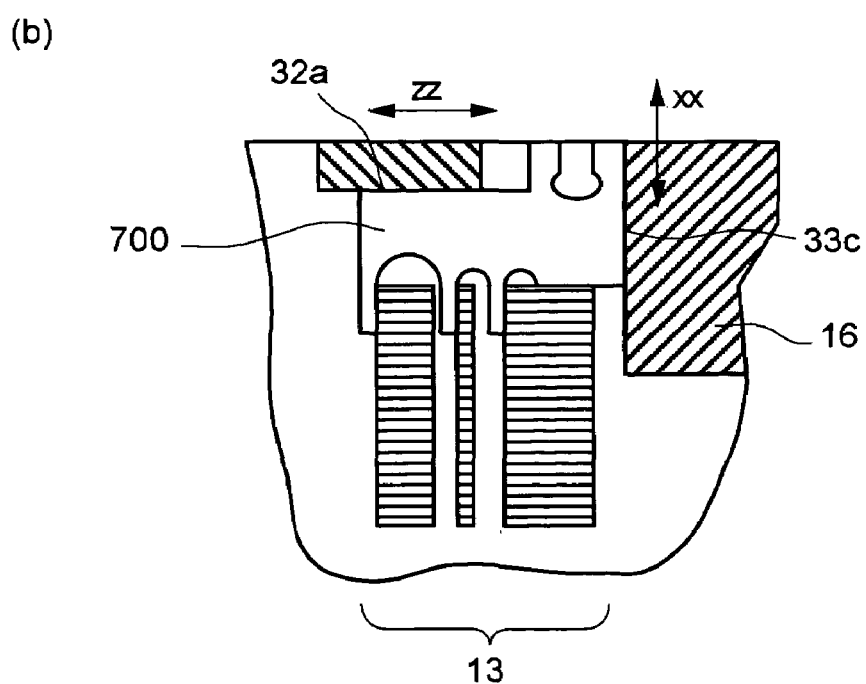
(b)

WAVELENGTH MONITOR, OPTICAL MODULE, AND OPTICAL MODULE PACKAGING METHOD

TECHNICAL FIELD

The present invention relates to a wavelength monitor that monitors lasing wavelength of laser light source, an optical module to output laser light, and an optical module packaging method.

BACKGROUND ART

In recent years, the technology related to a wavelength division multiplexing (hereinafter, "WDM") system is being developed. In the WDM system, plural light signals that have varying wavelengths are multiplexed and transmitted through a single optical fiber as if the light signals are transmitted through separate optical fibers. In the WDM system, the transmission capacity can be increased by, for instance, reserving a large band of many gigabit (hereinafter, "Gbit") per wavelength, multiplexing and transmitting the wavelengths of several hundreds of Gbit over a single optical fiber, and increasing the number of multiplexed wavelengths.

In the WDM system, in order to densely multiplex the light signals of varying wavelength bands, it is necessary to narrow down (to, for example, 50 giga hertz) the interval between each wavelength band, avoid overlapping of the wavelengths, and stabilize each wavelength band with precision. An optical module, which is employed as an optical transmission device compatible to the WDM system, outputs from the optical fiber the light signals, which have a specific wavelength band and are output from a mounted laser diode (hereinafter, "LD device"), after stabilizing the oscillation wavelength of the LD device. In this case, the light signals, which are output from all the optical fibers of the plural optical modules that have varying wavelength bands, are input into a single optical fiber via an optical coupler and then the wavelengths are multiplexed.

Conventional Art 1

A conventional optical module of this kind is disclosed in, for example, Japanese Patent Laid-Open Publication No. 2001-291928. This optical module monitors the oscillation wavelength of an LD device, adjusts the temperature of the LD device to lock the wavelength. This disclosure also discloses an optical module that is formed by serially placing an LD device which outputs as light signals laser light in forward as well as backward directions, a first photodiode (hereinafter, "PD device") that has a semi-transparent structure and receives as well as transmits the rear-facet light signals from the LD device, a wavelength filter that is formed of an etalon filter on which the light signals transmitted from the first PD device are incident and which possesses the wavelength-dependent transmission characteristics of those light signals, and a second PD device that receives the light signals transmitted from the wavelength filter. The output current of the first PD device is divided by the output current of the second PD device and, using the feature that the result of this division changes according to the wavelength, the oscillation wavelength of the LD device is monitored and according to the monitoring result the temperature in the vicinity of the LD device is controlled. Moreover, the output current of the first PD device is monitored based on the intensity of the output light from the LD device.

However, as this kind of an optical module employs in the first PD device a PD device that has a semi-transparent structure and inputs in succession into the wavelength filter and the second PD device the transmitted light from the first PD device, the amount of light of the light signals, which are transmitted by the wavelength filter and received by the second PD device, reduces because of transmission through the first PD device. As a result, the S/N characteristic of the signals deteriorates, and the oscillation wavelength of the LD device can not be monitored as desired.

Conventional Art 2

The optical module according to the conventional art 1 includes a beam splitter that splits into two a rear-facet laser light output from the LD device, a first PD device that receives one part of the light signals split by the beam splitter, a wavelength filter through which the remaining part of the light signals split by the beam splitter pass, and a second PD device that receives the light signals that have passed through the wavelength filter. The wavelength oscillation of the LD device is monitored based on the output current of the first PD device and the output current of the second PD device, and the intensity of the output light from the LD device is monitored according to the first PD device. A technology identical to this is also disclosed in the Japanese Patent Laid-Open Publication No. 2000-56185 and the Japanese Patent Laid-Open Publication No. 2001-244557.

The conventional technologies described in either the conventional arts 1 or 2 do not disclose a concrete structure of an optical component employed as the wavelength filter. Moreover, there is no mention either about the problems caused in the optical component due to a change in the temperature environment when the optical component is mounted inside the optical module or about the structure required to hold plural optical components. Although the Japanese Patent Laid-Open Publication No. 2000-56185 teaches to fix the wavelength filter onto the board either by soldering or with an adhesive, there is no disclosure of a concrete support structure to fix the wavelength filter by considering the thickness of the board, while holding the wavelength filter upright so that the laser light output from the LD device and parallel to the board passes through the wavelength filter.

Conventional Art 3

In the Japanese Patent Laid-Open Publication No. 2001-244557, a wavelength filter is fabricated as an optical component by juxtaposing two optical components, namely, a complex-refractive-index crystal that includes an etalon crystal structure and a polarizer. A technology is described that monitors the oscillation wavelength of a LD device by receiving into plural receiving devices the light passing through the wavelength filter. Especially in FIG. 8 of the disclosure, an example of a wavelength filter that cancels out the change in the refractive indices of the crystals corresponding to the crystalline temperature is disclosed, wherein two complex-refractive-index crystals are mounted beside each other so that according to the increase in the crystalline temperature the refractive index of one crystal increases and the refractive index of the other crystal decreases. An example is disclosed in which a combination of a $YVO_4$ crystal and a $\beta\text{-}BaB_2O_4$ crystal is employed as the two complex-refractive-index crystals.

However, the thickness of the complex-refractive-index crystal is about 0.05 millimeter (mm), making the crystal very thin and fragile. Hence it is difficult to mount the complex-refractive-index crystal inside the optical module.

Also, there is no disclosure either of a concrete structure for fixing plural wavelength filters inside the optical module so that the laser light output from the LD device passes through the wavelength filters or of the problems arising due to fixing of the wavelength filters.

In FIG. 8 of Japanese Patent Laid-Open Publication No. 2001-244557, a technology identical to the conventional art 2 is described that monitors wavelengths by receiving into two PD devices the signals that are split into two by a beam splitter.

As part of mounting the thin complex-refractive-index crystal inside the optical module, the inventors of the present invention conducted experiments. The results of these experiments are explained below.

To hold a complex-refractive-index crystal that is 1 mm or less thin upright inside the optical module, it is necessary to place a metal holder inside the optical module and hold the incident surface or the output surface of the laser light in the complex-refractive-index crystal by bonding the complex-refractive-index crystal to the metal holder.

However, if the complex-refractive-index crystal is soldered to the metal holder, a heat stress is generated at the junction because of the difference between coefficients of linear expansion of the metal holder and the complex-refractive-index crystal, and the optical characteristics of the complex-refractive-index crystal deteriorate due to the strain caused by a residual stress. Further, due to the change in the stress caused by a soldering-related shrinkage, cracks appear in the region around the junction and damage the complex-refractive-index crystal. This damage occurs even if the coefficients of linear expansion of the metal holder and the complex-refractive-index crystal are almost equal.

In the optical module according to the conventional art 1, the first PD device and the second PD device are placed before and after the wavelength filters that are serially placed over the optical path of the LD device. This makes the PD device longer in the arranging direction and hinders the downsizing of the optical module.

In the optical module according to the conventional art 2, the light signals, which are split into two by the beam splitter on a plane parallel to the bottom surface of the optical module, are received by the first PD device and the second PD device, respectively, that are disposed at separate positions on the sides of the output direction of the LD device. The LD device is also disposed on the plane parallel to the bottom surface of the optical module. Consequently, the area on the plane parallel to the bottom surface of the optical module that is occupied by the first PD device and the second PD device increases. This again hinders the downsizing of the optical module.

Also, it is necessary to set the first PD device and the second PD device adequately apart from each other and adjust the alignment of optical axes of the first PD device and the second PD device so that the directions of the optical axes split by the beam splitter coincide with the respective orthogonal directions. When each optical component is fixed inside the optical module, this adjustment can be very cumbersome.

The conventional art 3 has identical problems.

Moreover, in any of the conventional arts 1 through 3, there is no disclosure of a concrete support structure in order to hold the wavelength filters, which are formed by plural optical components, upright on the board.

Hence, the inventors of the present invention studied a structure in which the wavelength filters are bonded to the metal holder and the metal holder is disposed inside the optical module in such a way that the wavelength filters receive the rear-facet output light of the LD device. The experiments carried out by the inventors showed that the cracks appear in the complex-refractive-index crystal in the region where it is bonded to the metal holder.

When the inventors looked for the reason behind the problem, it became evident that although the coefficients of linear expansion of the metal holder and the complex-refractive-index crystal are almost the same, the coefficient of linear expansion of the complex-refractive-index crystal is larger in a specific direction (optical axis direction) owing to the anisotropic nature of the complex-refractive-index crystal. This difference in the coefficients of linear expansion is the cause of the heat stress generated at the junction.

Further, it was also discovered that when the complex-refractive-index crystal, which includes a cut edge, is bonded to the metal holder, the heat stress acts on the fine cracks or chaps on the cut edge, widening the cracks or the chaps. Consequently, the complex-refractive-index crystal is damaged resulting in deterioration of the optical characteristics of the complex-refractive-index crystal.

DISCLOSURE OF THE INVENTION

A wavelength monitor according to one aspect of the present invention includes a laser diode; a photodetector that receives output light of the laser diode; a wavelength filter disposed between the laser diode and the photodetector, the wavelength filter having an input surface and an output surface and a first side and a second side; and a support material that has a protrusion to which a part of any of the input surface or the output surface of first side of the wavelength filter is bonded.

The wavelength filter includes a first complex-refractive-index crystal, a second complex-refractive-index crystal and a polarizer, wherein the first complex-refractive-index crystal and the second complex-refractive-index crystal have difference refractive indices. The protrusion of the support material includes a first protrusion that bonds the first complex-refractive-index crystal, a second protrusion that bonds the second complex-refractive-index crystal, and a third protrusion that bonds the polarizer. Signs of the temperature-dependent change rate of the difference in the refractive index between the direction of an optical axis and an orthogonal direction to the optical axis in both the first complex-refractive-index crystal and the second complex-refractive-index crystal are reversed.

The wavelength filter includes two complex-refractive-index crystals, namely, a $YVO_4$ crystal and a $LiNbO_3$ crystal. The protrusion of the support material includes a first protrusion that bonds the $YVO_4$ crystal, a second protrusion that bonds the $LiNbO_3$ crystal, and a third protrusion that bonds the polarizer.

The photodetector includes a first photodiode and a second photodiode. The polarizer is disposed between the second photodiode and the complex-refractive-index crystal, and is smaller than the size of the complex-refractive-index crystal.

A cylindrical lens is disposed between the laser diode and the wavelength filter such that an axis line of the cylindrical lens is aligned parallel to the parallel direction of the first photodiode and the second diode.

The wavelength monitor includes a photodiode mount that bonds the first photodiode and the second photodiode to sides of the photodiode mount so that receiving surfaces of the first photodiode and the second photodiode are in parallel.

The wavelength monitor includes a carrier on which the laser diode, the support material, and the photodetector are fixed, directly or indirectly. The protrusion is provided on a side of the support material, and the bottom of the support material is bonded to the carrier. Another end side of the wavelength filter is not bonded to the support material.

A power supply board that supplies a current to drive the laser diode is provided on the carrier and is disposed on one side of the optical path of the laser diode and the photodetector.

A power supply board that supplies a bias current to the laser diode is provided on the carrier and is disposed on one side of the optical path of the laser diode and the photodetector.

The wavelength monitor includes a photodiode mount that is disposed on the top surface of the carrier and the photodetector is bonded to a side of the photodiode mount. The photodiode mount has a conductive layer on the top surface. A connection strip line is provided on the photodiode mount that connects the power supply board to a conductive plate, which is arranged at the other side of the optical path of the laser diode and the photodetector.

The carrier includes a first surface and a second surface, wherein there is a step between the first surface and the second surface. The laser diode is bonded directly or indirectly to the first surface of the carrier and the support material is bonded to the second surface.

The support material is made of metal. The support material and the wavelength filter are bonded by means of soldering or welding with low melting-point glass.

The support material is made of metal. The support material and any one of the incident surface and the output surface of one end side of the wavelength filter are bonded that form a non-bonded portion from bonding surface of the wavelength filter to the side end of the end side.

A bonding surface of the support material and the wavelength filter protrudes from the protrusion towards the bonding surface side.

The wavelength monitor according to the present invention comprises a laser diode, a first photodiode and a second photodiode that receive the output light from the laser diode, a complex-refractive-index crystal disposed between the laser diode and the first photodiode and the second photodiode, and a polarizer that is disposed between the second photodiode and the complex-refractive-index crystal, and is smaller than the size of the complex-refractive-index crystal.

The optical module according to the present invention comprises the wavelength monitor, a peltier on which the wavelength monitor is placed, and a control circuit that controls the temperature of the peltier based on outputs of the first photodiode and the second photodiode.

The optical module according to the present invention comprises the wavelength monitor in which an output light from one facet of the laser diode is incident on the wavelength filter, a lens to guide an output light from another facet of the laser diode to the outside, a peltier on which the wavelength monitor is placed, and a case in which the wavelength monitor, the lens, and the peltier are packaged.

A packaging method of the optical module according to the present invention comprises a first step of placing a laser-diode-mounted board on a carrier, a second step of placing a photodetector-mounted board on the carrier, a third step of bonding a lens to the carrier, a fourth step of bonding a part of any one of an incident surface to an output surface on one end side of the wavelength filter on a protrusion of a support material, and a fifth step of bonding the support material to the carrier by placing the support material at a position where the support material makes contact with a contact surface provided on the carrier.

A wavelength monitor according to another aspect of the present invention includes a laser diode; a first photodiode and a second photodiode that receive output light of the laser diode; a complex-refractive-index crystal disposed between the laser diode and the first photodiode and the second photodiode; and a polarizer disposed between the second photodiode and the complex-refractive-index crystal, wherein the polarizer is smaller than the complex-refractive-index crystal.

An optical module according to still another aspect of the present invention includes the wavelength monitor according to the present invention; a peltier that holds the wavelength monitor; and a control circuit that controls a temperature of the peltier based on outputs of the first photodiode and the second photodiode.

An optical module according to still another aspect of the present invention includes the wavelength monitor according to the present invention, wherein an output light from one facet of the laser diode is incident on the wavelength filter; a lens to guide an output light from an other facet of the laser diode to the outside; a peltier that holds the wavelength monitor; and a package that houses the wavelength monitor, the lens, and the peltier.

An optical packaging method according to still another aspect of the present invention includes placing a laser-diode-mounted board on a carrier; placing a photodetector-mounted board on the carrier; bonding a lens on the carrier; bonding a part on one side of any one of an input surface and an output surface of a wavelength filter on a protrusion of a support material; and bonding the support material on the carrier by placing the support material at a position where the support material makes a contact with a bonding surface provided on the carrier.

The other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 1 is a schematic diagram of the wavelength monitor according to a first embodiment of the present invention;

FIG. 2 is a schematic diagram of the optical module according to the first embodiment of the present invention;

FIG. 3 is a schematic diagram of support structure of the wavelength filter according to the first embodiment of the present invention;

FIG. 7 illustrates wavelength variation of the wavelength filter;

FIG. 11 is a schematic diagram of the metal holder according to a second embodiment of the present invention;

BEST MODE FOR CARRYING OUT THE INVENTION

Figure 4:
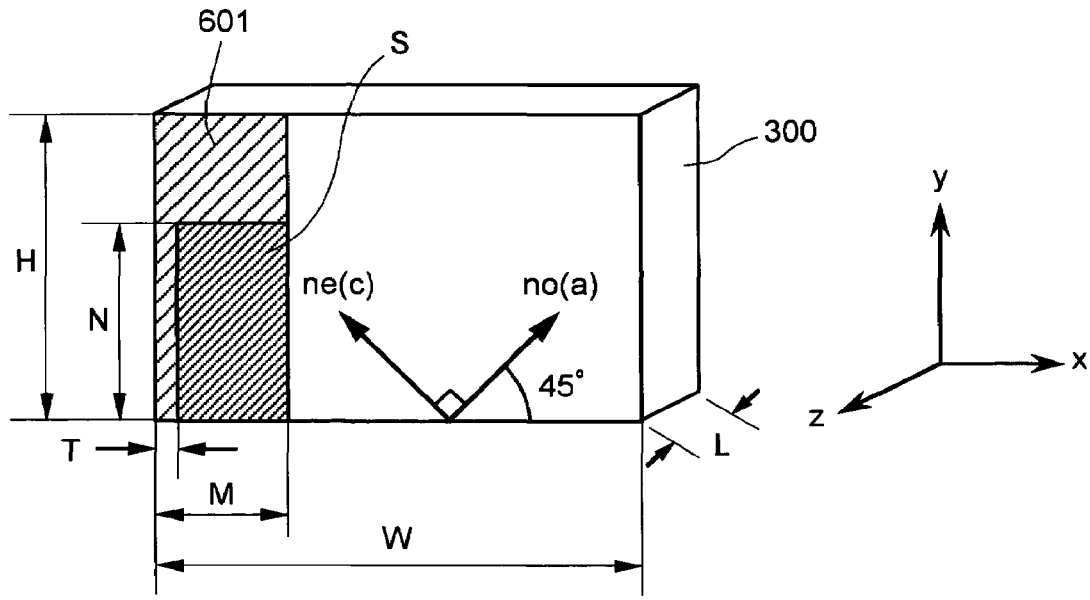
FIG. 4 illustrates a layout relation of the optical axis of the complex-refractive-index crystal with the junction surface according to the first embodiment of the present invention.

Exemplary embodiments according to the present invention will now be explained in detail with reference to the accompanying drawings.

A first embodiment according to the present invention relates to a wavelength monitor, an optical module, and an optical transmitter. The wavelength monitor includes a metal holder that is placed over an optical path of light signals. The metal holder is bonded to an optical component, such as a complex-refractive-index crystal or a polarizer, etc. that constitutes a wavelength filter. The optical module, on which the wavelength monitor is disposed, outputs the light signals. The optical transmitter adjusts, based on the monitoring result of the wavelength monitor, the wavelength and the intensity of the output light from the optical module. Prior to describing the structure according to the present invention, the fundamental principle of a wavelength filter that employs a complex-refractive-index crystal is described.

In the Japanese Patent Application No. 2001-336583 that was filed by the inventors of the present application, a technology relating to a wavelength filter that uses a uniaxial complex-refractive-index crystal is disclosed. The uniaxial complex refractive index crystal is anisotropic in nature in that its refractive index varies depending on the direction. In this wavelength filter, the complex-refractive-index crystal is employed as a wavelength plate that changes, according to the wavelength of a transmitted light, the direction of polarization of the transmitted light. The transmitted light of the wavelength plate is then passed though the polarizer where the intensity of that transmitted light changes according to the wavelength. By using this unique characteristic, the wavelength filter differentiates the wavelengths of a laser light.

In this wavelength filter, the wavelength plate is formed by juxtaposing two complex-refractive-index crystals, namely, a $YVO_4$ crystal and a $LiNbO_3$ crystal (hereinafter, "LN crystal"). Refractive indices of these two complex-refractive-index crystals change in mutually opposite directions as the crystalline temperature changes. Consequently, the change in the refractive indices is canceled out. Moreover, the $YVO_4$ crystal and the LN crystal can be easily mass-produced at a low cost.

The thickness of the $YVO_4$ crystal is 0.97 mm and that of the LN crystal is 0.15 mm. Thus, the crystals are sufficiently thin but they are not easily breakable and can be safely handled.

In the complex-refractive-index crystals, a specific axial direction in which the refractive index is different than in the other two axes is called an optical axis (C-axis) and the axial direction perpendicular to this optical axis is called A-axis.

Usually, the $YVO_4$ crystal is employed in an isolator, etc. and the LN crystal is employed in a waveguide, etc. of a Mach-Zehnder optical modulator. Both the $YVO_4$ crystal and the LN crystal are comparatively easily available.

On a plane perpendicular to the traveling direction of the laser light that is incident on the complex-refractive-index crystals, there are present a fast axis and a slow axis in mutually orthogonal directions. The polarization in the fast axis direction has a low refractive index and a high wave velocity, while the polarization in the slow axis direction has a high refractive index and a low wave velocity.

Consequently, when the laser light that includes the two orthogonal polarization components is incident on the complex-refractive-index crystals, the output light causes a phase shift $\delta$ along both the axes and the polarization condition alters. If we assume the wavelength of the laser light to be $\lambda$, the refractive indices that the polarization of the C-axis and the A-axis have to be $n_e$ and $n_o$, respectively, and the length in the laser light propagation direction as L, then the amount of phase shift $\delta$ is determined by the expression $\delta = 2\pi (n_e - n_o) L/\lambda$, the amount of phase shift $\delta$ being a function of the wavelength $\lambda$. (The wavelength plate in which the amount of phase shift $\delta = \frac{1}{4}\pi$, $\delta = \frac{1}{2}\pi$ is called a quarter waveplate and that in which the amount of phase shift $\delta = \frac{1}{2}\pi$ is called a half waveplate.)

A wavelength plate is fabricated using these complex-refractive-index crystals. A wavelength filter that alters the intensity of the transmitted light depending on the wavelength can be fabricated by further placing a polarizer after the complex-refractive-index crystals.

Figure 14:
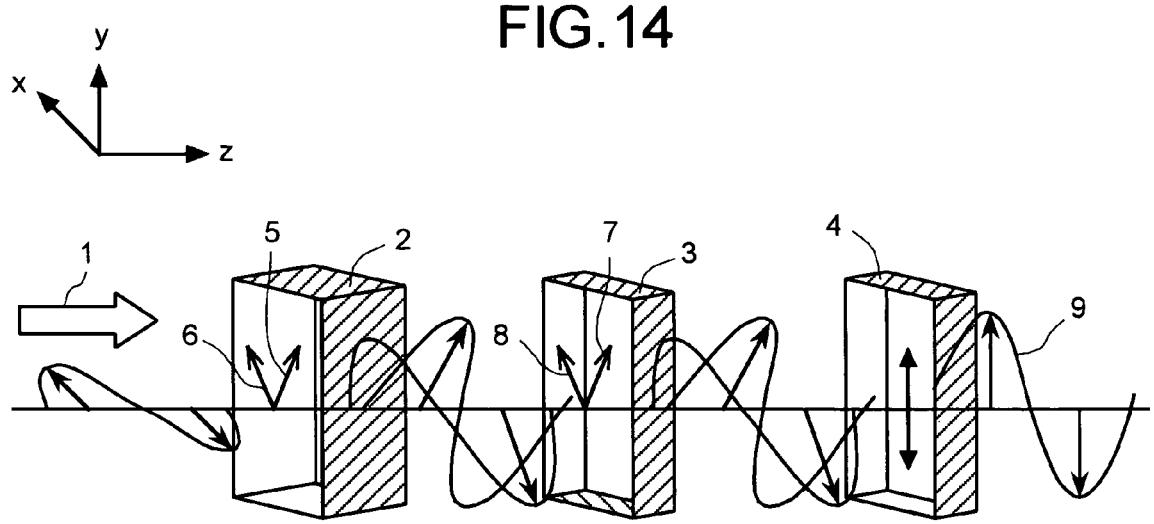
FIG. 14 illustrates operation principle of the wavelength filter.

FIG. 14 illustrates the basic operation of the wavelength filter described in the Japanese Patent Application No. 2001-336583. This wavelength filter includes the complex-refractive-index crystals, namely, a $YVO_4$ crystal 2 and a LN crystal 3, and a polarizer 4. The polarizer 4 lets only a component of the light polarized in the Y-axis direction to pass through it and absorbs or reflects components polarized in the X-axis direction. A laser light 1 that includes the X-axis polarization component is incident on the wavelength filter along Z-axis.

A C-axis 5 of the $YVO_4$ crystal 2 is an axis on the XY plane and inclined at 45° with respect to the direction of polarization (which is the X-axis) of the $YVO_4$ crystal 2. An A-axis 6 of the $YVO_4$ crystal 2 is an axis that is orthogonal to the C-axis 5 and on the same plane as the C-axis 5. The C-axis 5 of the $YVO_4$ crystal 2 is the slow axis i.e., velocity of light in the direction of the C-axis 5 is low and the refractive index is high. On the other hand, the A-axis 6 is the fast axis, i.e., velocity of light in the direction of the A-axis 6 is high and the refractive index is low.

A C-axis 7 of the LN crystal 3 is an axis on the XY plane and inclined at 45° with respect to the X-axis. An A-axis 8 of the LN crystal 3 is an axis that is orthogonal to the C-axis 7 and in the same plane as the C-axis 7. The C-axis 7 of the LN crystal 3 is the fast axis, while the A-axis 8 of the LN crystal 3 is the slow axis.

As the $YVO_4$ crystal 2, a rectangular plate of dimensions 2.5 mm (along X-axis), 2.4 mm (along Y-axis) and thickness $L_A$ (along Z-axis) 0.9725 mm has been used. Similarly, as the LN crystal 3, a rectangular plate of dimensions 2.5 mm (along X-axis), 2.4 mm (along Y-axis), and thickness $L_B$ (along Z-axis) 0.1494 mm has been used.

The laser light 1 is first incident on the $YVO_4$ crystal 2. As the wave velocity of the laser light 1 that has entered the $YVO_4$ crystal 2 is higher for the polarization component in the A-axis than in the C-axis, the polarization status of the laser light 1 changes while passing through the YVO$_4$ crystal 2.

This change in the polarization status is caused due to the phase shift between the C-axis direction and the A-axis direction. If we assume the wavelength of the laser light to be λ, the difference between the refractive indices of the C-axis and the A-axis (hereinafter, "refractive index difference") to be $\Delta n_A$, and the length of the laser light propagation direction as $L_A$, then the amount of phase shift δ can be obtained from $\delta=2\pi\Delta n_A L_A/\lambda$.

A portion of the laser light that has passed through the YVO$_4$ crystal 2 and propagated along Z-axis is then incident on the LN crystal 3. As the wave velocity of the laser light that has entered the LN crystal 3 is higher for the polarization component in the A-axis than in the C-axis, the polarization status of the laser light changes while passing through the LN crystal 3.

This change in the polarization status is caused due to the phase shift between the C-axis and the A-axis. If we assume the wavelength of the laser light to be λ, the difference between the refractive indices of the C-axis and the A-axis (hereinafter, "refractive index difference") to be $\Delta n_B$, and the length of the laser light propagation direction as $L_B$, then the amount of phase shift δ is determined by the expression $\delta=2\pi\Delta n_B L_B/\lambda$.

In this way, the amount of phase shift δ, between the C-axis direction and the A-axis direction of the laser light that has passed through the YVO$_4$ crystal 2 and the LN crystal 3, is can be obtained from:

$$\delta = 2\pi(\Delta n_A L_A + \Delta n_B L_B)/\lambda \tag{1}$$

where, δ is a function of the wavelength λ. The variation in the wavelength λ according to the temperature can be obtained from:

$$\frac{\partial \lambda}{\partial T} = \left\{ \left( \frac{d\Delta n_A}{dT} + \alpha_A \cdot \Delta n_A \right) \cdot L_A + \left( \frac{d\Delta n_B}{dT} + \alpha_B \cdot \Delta n_B \right) \cdot L_B \right\} \cdot \lambda / (\Delta n_A \cdot L_A + \Delta n_B \cdot L_B) \tag{2}$$

where $\alpha_A$ is a coefficient of linear expansion in the direction of the propagation of the laser light of the YVO$_4$ crystal 2, while $\alpha_B$ is a coefficient of linear expansion in the propagation direction of the laser light of the LN crystal 3.

Consequently, if the YVO$_4$ crystal 2 and the LN crystal 3 are manufactured so that their respective thickness $L_A$ and $L_B$ satisfy the expression (3), then the right side of the expression (2) becomes zero and theoretically the change in the wavelength caused due to the change in the temperature gets canceled out:

$$\left( \frac{d\Delta n_A}{dT} + \alpha_A \cdot \Delta n_A \right) \cdot L_A + \left( \frac{d\Delta n_B}{dT} + \alpha_B \cdot \Delta n_B \right) \cdot L_B = 0 \tag{3}$$

As an example, when the thickness $L_A$ of the YVO$_4$ crystal 2 and the thickness $L_B$ of the LN crystal 3 are respectively set to 0.9725 mm and 0.1494 mm, then the expression (3) is satisfied by setting the material properties such as $\Delta n_A=0.2039$, $\Delta n_B=-0.0731$, $d\Delta n_A/dT=5.5$ [×10$^{-6}$/K], $d\Delta n_B/dT=31.1$ [×10$^{-6}$/K], $\alpha_A=4.5$ [×10$^{-6}$/K], and $\alpha_B=15.7$ [×10$^{-6}$/K]. As the change in the respective Δn gets canceled, theoretically the change in δ then becomes zero and the change in the wavelength is suppressed.

An intensity Ip of a laser light 9, which has passed through the polarizer 4, is obtained from the amount of phase shift δ. The polarizer 4 lets only the Y-axis polarization component pass through. As the C-axis of the YVO$_4$ crystal 2 and the LN crystal 3 is inclined at 45° with respect to the X-axis, the intensity Ip of the laser light that has passed through the polarizer 4 is calculated according to the Jones matrix with the angle taken as 45°, and is determined by the expression (4).

$$Ip = \sin(\delta/2)^2 \tag{4}$$

On the other hand, if a polarizer is employed that transmits to the polarizer 4 only the X-axis polarization component, the value of Ip becomes $\cos(\delta/2)^2$.

According to the expressions (1) and (4), δ is a function of the wavelength. Therefore, by measuring the intensity Ip of the laser light that has passed through the polarization 4 using a photodetector such as a PD device, a wavelength-dependent characteristic, in other words, a wavelength-differentiation characteristic can be obtained.

Figure 15:
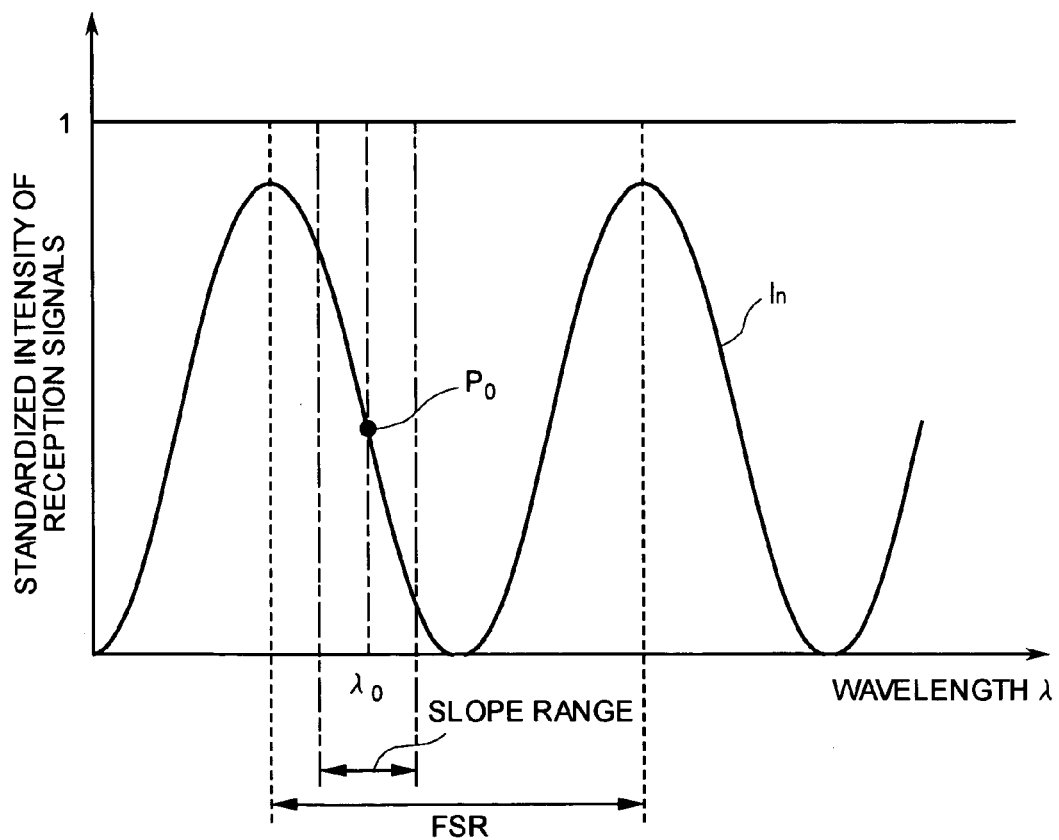
FIG. 15 is a graph illustrating relation between the wavelength and normalized intensity of the optical signals received.

FIG. 15 illustrates a standardized intensity In, which is obtained by subtracting from the intensity Ir of the laser light 1 that is incident on the wavelength filter (before passing through the wavelength filter) the intensity Ip of the laser light 9 that has passed through the polarizer 4. In FIG. 15, FSR indicates a periodic interval called a free spectrum region and is determined by the expression (5). In the wavelength filter described above that employs the YVO$_4$ crystal 2 and the LN crystal 3, when the wavelength λ is 1.55 µm the free spectrum region is roughly equal to 1600 GHz (12.8 nm).

$$FSR = \frac{\lambda^2}{(\Delta n_A \cdot L_A + \Delta n_B \cdot L_B)} \tag{5}$$

In this free spectrum region, for instance, within a slope range that is almost close to a straight line and includes a wavelength $\lambda_o$, the wavelengths are uniquely determined from the standardized intensity of receptions signals. Therefore, the wavelengths can be differentiated based on the reception signals.

FIG. 1 illustrates a structure of the wavelength monitor according to the first embodiment of the present invention. FIG. 1(a) is a top view of the wavelength monitor, FIG. 1(b) illustrates a photodetector as seen from a receiving surface side (that is, from the right side of FIG. 1(a)), FIG. 1(c) illustrates the region around a junction of a conductive track provided in a power supply board, and FIG. 1(d) is a perspective view of the top surface of a carrier 16, which is a component of the wavelength monitor.

In FIG. 1(a) and FIG. 1(d), the Z-axis indicates the direction of a light output from the rear-facet of a laser diode (LD device) 11, the Y-axis indicates the upward direction of the wavelength monitor, and the X-axis indicates a direction orthogonal to the Z-axis and the Y-axis. These coordinate axes are uniform throughout the following description of the present embodiment.

In FIG. 1, the LD device 11 laser-oscillates and outputs a laser light in forward direction (indicated by arrow B) as well as backward direction (indicated by arrow A). A cylindrical drum lens 12 is disposed behind the LD device 11. The light output from the rear-facet of the LD device 11 converges into the drum lens 12. The drum lens 12 is disposed behind the LD device 11 in such a way that the longitudinal direction of the drum lens 12 (axis direction of the cylinder) coincides with the Y-axis direction.

Maximum laser light converges into the drum lens 12 when the cross-section of the emitting and receiving end of the LD device 11 on the ZX plane, from which the laser light enters and leaves, is circular. As the cross-section of the emitting and receiving end shifts from the ZX plane towards the YZ plane, the cross-section becomes elliptical with an elongating longitudinal axis and reducing curvature at the emitting and receiving end, thus resulting in gradual decrease in the concentration of the laser light. On the YZ plane, the cross-section of the laser light emitting and receiving end becomes planar, resulting in almost no convergence of the laser light.

A wavelength filter 13 is disposed behind the drum lens 12. The transmissivity of the wavelength filter 13 depends upon the wavelengths. The intensity of the transmissivity changes according to the wavelength of the laser light that is incident on the wavelength filter 13. A first photodiode (PD device) 14a and a second photodiode (PD device) 14b hereinafter collectively called as PD device 14 are disposed as the photodetectors behind the wavelength filter 13. The first PD device 14a and the second PD device 14b, which are disposed next to each other along Y-axis, receive the transmitted light (indicated by arrow D) from the wavelength filter 13 and output an electric current according to the intensity of the received light.

An LD mount 15 is made of a material of silicon carbide (SiC) and includes an earth (i.e., ground) conductor 15a that grounds the anode end of the LD device 11 and a conductive track 15b that supplies electric signals to the cathode end of the LD device 11. The LD device 11, which is mounted on the LD mount 15, is soldered on the top surface of the ground conductor 15a.

The carrier 16 is made of metal. On a surface 16a of the carrier 16 the LD mount 15 is mounted and the ground conductor 15a of the LD mount 15 is grounded. On another surface 16b, which is a step lower than the surface 16a, the drum lens 12, a metal holder 17, and a PD mount 18 are mounted. The bottom surface of the metal holder 17 is mounted on the surface 16b of the carrier 16. The metal holder 17 works as a support material for the wavelength filter 13. The PD mount 18 is made of, for instance, aluminum oxide (Al2O3) ceramic and is mounted on the surface 16b of the carrier 16. The cathode ends of the first PD device 14a and the second PD device 14b are supported by and bonded to the sides of the PD mount 18. The first PD device 14a and the second PD device 14b are arranged vertically along Y-axis and are disposed on the sides of the PD mount 18 so that their receiving surfaces face towards the wavelength filter 13.

The LD mount 15 is bonded to the carrier 16 by means of soldering and the drum lens 12 is bonded to the carrier 16 by means of soldering or welding with low melting-point glass. It is desirable that the drum lens is bonded by a Sn—Pb alloy. It is also desirable that the metal holder 17 be bonded to the carrier 16 by means of YAG welding.

A Cu—W—Ni alloy of copper-tungsten is used in the carrier 16, while an iron-sulfur-cobalt alloy (product name: Kovar) is used in the metal holder 17. However, stainless steel such as SUS304, SUS316, SUS430F, and SUS450, etc. may also be used as the other metal material in making the metal holder 17

The height of the top surface of the drum lens 12, the PD mount 18, and the wavelength filter 13 is roughly the same.

It would be ideal if in the metal holder 17 or the PD mount 18 the light receiving surface of the wavelength filter 13 or the PD device 14 is on the ZX plane (around the Y-axis) and inclined with respect to the output direction of the laser light. In this way, by placing a light incident surface inclined, the problem of the laser light getting reflected from the light incident surface of the wavelength filter 13 or the receiving surface of the PD device 14 and re-entering the LD device 11 can be avoided.

In the PD mount 18, the first PD device 14a and the second PD device 14b are serially mounted along Y-axis on the same plane as that of the side surface. This arrangement is ideal for the soldering process of the PD devices. However, the first PD device 14a and the second PD device 14b may also be mounted on two different planes which are parallel to the light incident surface of the light signals with a level difference between them, wherein there is a step between the corresponding side surfaces of the PD mount 18.

In this way, by mounting together the first PD device 14a and the second PD device 14b on the PD mount 18, the alignment with the other optical components such as the wavelength filter 13 and the drum lens 12, or the LD device 11 can be carried out comparatively easily.

On the surface 16b of the carrier 16 shown in FIG. 1, a rectangular power supply board 20 is disposed in such a way that the longitudinal direction of the power supply board 20 is parallel to the output direction of the LD device 11. On the power supply board 20, a conductive track 21, which constitutes a broad conductive track 21a and a narrow conductive track 21b, is disposed. The broad conductive track 21a and the narrow conductive track 21b are orthogonal to each other and form an L. One end of a metal wire 19a is connected to one end of the conductive track 15b and the other end is connected to the conductive track 21. One end of another metal wire 19b is connected to the other end of the conductive track 15b and the other end is connected to the cathode end of the LD device 11. The electric signals that drive the LD device 11 are transmitted via this wire 19b. The conductive track 21a has a circular curve, as shown in FIG. 1(c), and the curved portion of the conductive track 21a takes a 90°0 bend.

The conductive track 21a is connected to a conductive track 22 via a thin-film resistor 22b that is provided for impedance matching and DC level signals suppression. The conductive track 22 is mounted on the power supply board 20 and supplies to the conductive track 21 resistance frequency signals (RF signals) that modulation-drive the LD device 11. One end of a metal wire 23 is connected to the conductive track 21b and the other end is connected to a bias circuit 24. The bias circuit 24 is disposed on the side where the PD device 14 is mounted on the power supply board 20. The bias circuit 24 supplies to the conductive track 21 via the wire 23 DC level electric signals (bias signals) that provide a bias current to the LD device 11. A low pass filter is provided in the bias circuit 24 in order to block the resistance frequency signals.

The other end of the bias circuit 24 is connected to a conductive pad 26 via a metal wire 25. The conductive pad 26 is mounted on the top surface of the PD mount 18. A conductive track 27a and a conductive track 27b are disposed across the top surface of the PD mount 18 and the PD device bonding surface (side surface). The conductive track 27a is connected to the anode end (the terminal on the receiving surface end) of the first PD device 14a via a wire 100a and the conductive track 27b is connected to the anode end (the terminal at the receiving surface end) of the second PD device 14b via a wire 100b. The conductive track 27a and the conductive track 27b are disposed apart from each other on either side of the conductive pad 26.

A conductive track 28 is disposed across the top surface of the PD mount 18 and the PD device bonding surface (side surface) and commonly connected to the cathode ends (the terminals on the ground surface end) of the first PD device 14a and the second PD device 14b. The conductive track 28 is disposed apart from and between the conductive track 27a and the conductive track 27b.

The conductive track 28 may also be mounted on separate substrates for each of the first PD device 14a and the second PD device 14b and may be connected on the top surface of the PD mount 18 by means of wires. As for the power supply board 20, a separate board may be provided on which the bias circuit 24 may be mounted.

A temperature detector 29 is placed on the surface 16a of the carrier 16. A thermistor 29b is provided in the temperature detector 29. The temperature detector 29 outputs electric current signals according to the temperature of the LD device 11.

The wavelength monitor comprises the carrier 16 with all these components included in it.

A first lens 30, into which the front-facet output light of the LD device 11 converges and which outputs to outside the converged light as light signals, is placed in front of the LD device 11. A lens holder 31 that supports the first lens 30 is bonded to the front surface of the carrier 16 (front-facet output light end of the LD device 11). The lens holder 31 is made of stainless steel such as SUS430F and is bonded to the carrier by means of YAG welding.

A protrusion 32 is provided on the surface 16b of the carrier 16. The protrusion 32 includes an attachment facet 32a to which the metal holder 17 is attached and fixed along X-axis. The side faces 33c, 33a, and 33b that are perpendicular to the surface 16a and the surface 16b of the carrier 16 also function as attachment facets. The attachment facet 33c fixes the metal holder 17 along Z-axis. In other words, the metal holder 17 is fixed to the surface 16b of the carrier 16 with the metal holder 17 attached to the attachment facet 32a along X-axis and the attachment facet 33c along Z-axis. The attachment facet 33a is for the attachment of the drum lens 12 and fixes the drum lens 12 along X-axis. The attachment facet 33b again is for the attachment of the drum lens 12 and fixes the drum lens 12 along Z-axis. In other words, the drum lens 12 is fixed to the surface 16b of the carrier 16 with the drum lens 12 attached to the attachment facet 33a along X-axis and the attachment facet 33b along Z-axis.

The height of the protrusion 32 is the same as that of the surface 16a. Consequently, the carrier 16 comprises the surfaces 16a and 16b with their top surfaces at different heights, as shown in FIG. 1(d).

Further, by slightly inclining the attachment facets 32a and 33c with respect to the optical axis of the light signals, the metal holder 17 and the wavelength filter 13 can be easily placed inclined with respect to the optical axis of the light signals.

An optical module according to the first embodiment of the present invention is explained next. The optical module includes the wavelength monitor shown in FIG. 1. FIG. 2(a) is a top view of the optical module without a top cover. FIG. 2(b) is a sectional side view seen from the CC direction shown in FIG. 2(a). FIG. 2(c) is a front view (right-hand side of FIG. 2(a)) when the region around the LD device 11, which is a component of the wavelength monitor, is cut in XY plane.

A case 40 made of metal constitutes a rectangular bottom 40a, a sidewall 40b that surrounds all sides of the rectangular bottom surface 40a, and an inward projection 40c of the bonding surface of the sidewall 40b that is provided with a through-hole through which the front-facet output light of the LD device 11 passes. The case 40 includes the carrier 16 mounted on the wavelength monitor. A top cover 50 is disposed on the top surface of the case 40 such that it fits over the opening on the top surface of the case 40. The top cover 50 is bonded to the case 40 by means of seam welding so that airtightness is maintained inside the case.

A peltier 41 is disposed on the bottom surface 40a of the case 40. The carrier 16 is placed on the top surface of the peltier 41. The peltier 41 cools or heats the LD device 11 by influencing the carrier 16 and thus adjusts a temperature T of the LD device.

A feed-through 42a and a feed-through 42b are inserted in and bonded to the sidewall 40b on either side of the optical path of the output light from the LD device 11. The feed-through 42a and the feed-through 42b comprise a ceramic dielectric material with a conductive layer 200 provided both inside and outside the dielectric material. The feed-through 42a and the feed-through 42b transmit electric signals inside and outside of the case 40. When facing the LD device 11, the feed-through 42a is considered to be on the right side (orthodromic X-axis side) and the feed-through 42b is considered to be on the left side.

The conductive layer 200 provided in the feed-through 42a and the feed-through 42b is connected to a lead 51. A lead 51a is connected via a wire 60 to the temperature detector 29. A lead 51b is connected via a wire 61 to the conductive pad 26. A lead 51c is connected via a wire 62a to the conductive track 27a disposed on the top surface of the PD mount 18. Leads 51e and 51d are connected to the electrodes of the peltier 41. An electric current that drives the peltier 41 is supplied via the leads 51e and 51d.

A lead 51f is connected via a wire 64 to the conductive track 28 disposed on the top surface of the PD mount 18. A lead 51g is connected via a wire 62b to the conductive track 27a disposed on the top surface of the PD mount 18. A lead 51l is connected via a wire 63 to the ground surface of the LD device 11 in the carrier 16. The lead 51l is connected to the ground outside the case 40. A lead 51i is connected via the wire 64 to the conductive track 22 and transmits RF signals. A lead 51m transmits signals other than the RF signals.

An optical window 43 is bonded to the side surface of the projection 40c such that the optical window 43 faces the first lens 30 at the front-facet optical path end of the LD device 11. The surface at one end of a lens holder 45 is bonded by means of YAG welding to the outer surface of the sidewall 40b of the case 40. The tubular lens holder 45 supports a second lens 44 in such a way that the optical axis of the second lens 44 and the optical axis of the first lens 30 are roughly the same. A front-facet laser light emitted by the LD device 11 that has passed through the first lens 30 is incident on the second lens 44. A tubular fiber holder (ferrule holder) 47 is bonded by means of YAG welding to the surface at the other end of the lens holder 45. The fiber holder 47 supports a ferrule 46b of an optical fiber 46 that is passed through an opening at the laser output end.

A front-facet optical system, comprising the lens holder 45, the fiber holder 47 and the optical fiber 46, constitutes an optical interface 65 that transmits to external devices as light signals the front-facet output light emitted from the LD device 11.

To sum up, an optical module 66 is fabricated by first mounting in the case 40 the peltier 41 and the carrier 16. The leads and the conductive tracks of the carrier 16 are then connected by wires. The optical interface 65 is then connected to the case 40. Finally, the top cover 50 is bonded to the case 40.

As shown in FIG. 2(c), the height of the top surface of the conductive track 21a provided on the power supply board 20 is almost the same as the height of the conductive track 15b provided on the LD mount 15.

It is desirable that in the region where the conductive track 200 is connected to the lead 51i the height of the top surface of the feed-through 42a be almost the same as the height the top surface of the power supply board 20.

A not shown electronic circuit board, on which the optical module 66 is mounted and which is connected to the lead 51, supplies the electric power to the optical module 66 via the leads 51e, 51d, and 51b provided on the feed-through 42b side. The leads that supply the electric power to the optical module 66 can be placed on one side of the optical module 66 and a power supply circuit that supplies the electric power to the optical module 66 can be placed close to the other side (on the feed-through 42b side) of the optical module 66.

A wiring route (power supply line) that supplies the electric power from the power supply circuit to the optical module 66 may be assembled around the leads 51e, 51d, and 51b.

The lead 51i that supplies the RF signals is placed on the other side (on the feed-through 42a side) of the optical module 66. Hence, a driver that supplies the RF signals to the LD device 11 and a wiring route (RF signals line) are also placed on the same side of the optical module.

Consequently, by placing the power supply circuit as well as the power supply line on one side of the optical module 66 and the driver that supplies the RF signals as well as the RF signals line on the other side of the optical module 66, the electromagnetic interference between the electric power and the driver can be suppressed to a certain extent.

The bias signals, which are input from the lead 51b via the feed-through 42b, are relayed to the conductive pad 26, which is connected to the wire 61 and the wire 25 on the top surface of the PD mount 18. The bias signals are then transmitted to the lead 51b and the power supply board 20, avoiding the wavelength filter 13, which is disposed between the power supply board 20 and the lead 51b. That is, a bias signals supply line that connects the lead 51b to the power supply board 20 is disposed so as to bypass the wavelength filter 13 and not to pass beneath or around the wavelength filter 13.

Gold is used in the bias signals supply line and gold wires are connected in order to transmit signals to the feed-through 42a or the bias circuit 24. When the bias signals supply line or the gold wires are placed beneath the wavelength filter 13, some of the light signals passing through the wavelength filter 13 get reflected. Consequently, by placing the bias signals supply line so as to bypass the wavelength filter 13, the effect on the wavelength filter 13 caused due to the reflection of the light signals can be suppressed.

As the bias signals supply line is not placed beneath the wavelength filter 13, the bottom of the wavelength filter 13 can be lowered and brought close to the carrier top surface 16b.

Moreover, there is no need to provide a separate relay board in order to fabricate the bias signals supply line because the top surface of the PD mount 18 may be used as the relay board, thus making the structure of the optical module simpler. By merging the RF signals and the bias signals on the same power supply board 20, the structure of the optical module may be further simplified as compared to a structure in which separate power supply boards are used for the RF signals and the bias signals.

Another mode of placing the bias circuit 24 may be to place a bias circuit that is separate from the power supply board 20 in the space available on the top surface of the feed-through 42a.

An optical module that obtains a signal light of a specific wavelength at a specific intensity may also be fabricated, without supplying modulation signals to the LD device 11. For instance, a structure may be such that only the bias signals are supplied in the conductive track 21 of the power supply board 20, without supplying the RF signals in the conductive track 22 of the power supply board 20. In this case, the bias circuit 24 is not required at all. Another mode of the structure may be such that the bias signals are supplied to the conductive track 22 from the feed-through 42a, and not to the conductive track 21b.

Figure 13:
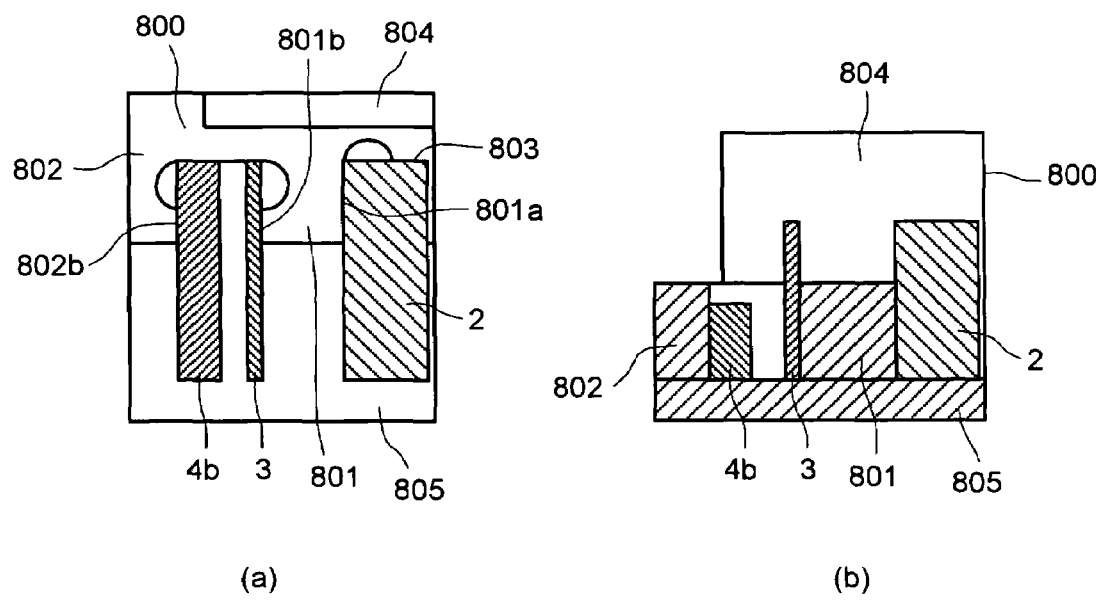
FIG. 13 a schematic diagram of the metal holder according to a fourth embodiment of the present invention.

FIG. 3 illustrates a support structure of the wavelength filter 13 according to the first embodiment of the present invention. FIG. 3(a) is a top view (view of FIG. 1(a) as the page is viewed from top) and FIG. 3(b) is a side view (view of FIG. 1(a) as viewed towards the negative X-axis). The reference numerals in FIG. 3 identical to those in FIG. 13 represent identical components.

As shown in FIG. 3, the metal holder 17 includes holders 70a, 70b, and 70c that protrude at plural places towards the X-axis (and parallel to each other) like the teeth of a comb. One end facet of the laser light output end of each of the $YVO_4$ crystal 2, the LN crystal 3, and a polarizer 4b are bonded to one side surface of a light incident end of the respective holders 70a, 70b, and 70c.

The bonding surface of each of the holders 70a, 70b, and 70c is oriented towards the same direction (towards the negative Z-axis). The holders and the optical components are placed alternately in the sequence of the $YVO_4$ crystal 2, the holder 70a, the LN crystal 3, the holder 70b, the polarizer 4b, and the holder 70c. Each holder is bonded to the respective optical component.

The optical components such as the $YVO_4$ crystal 2, the LN crystal 3, and the polarizer 4b constitute a wavelength filter that varies the intensity Ip of the light passing through the polarizer 4b according to the oscillation wavelength of the laser light. As the $YVO_4$ crystal 2, for instance, a rectangular plate of length $W_A$ 2.5 mm (along X-axis), length $H_A$ 2.4 mm (along Y-axis) and thickness $L_A$ (along Z-axis) 0.9725 mm has been used. Similarly, as the LN crystal 3, for instance, a rectangular plate of length $W_B$ 2.5 mm (along X-axis), length $H_B$ 2.4 mm (along Y-axis), and thickness $L_B$ (along Z-axis) 0.1494 mm has been used. The size of the $YVO_4$ crystal 2 and the LN crystal 3 is the same on the XY plane that is perpendicular to the optical axis of the laser light output from the LD device 11.

The coefficient of linear expansion of the $YVO_4$ crystal 2 is $11.4 \times 10^{-6}$ [1/° C.] along C-axis and $4.43 \times 10^{-6}$ [1/° C.] along A-axis. The coefficient of linear expansion of the LN crystal 3 is $4.0 \times 10^{-6}$ [1/° C.] along C-axis and $15.7 \times 10^{-6}$ [1/° C.] along A-axis.

As the polarizer 4b, for instance, a rectangular Polarcor (product name) of length $W_C$ 2.5 mm (along X-axis), length $H_C$ 1.1 mm (along Y-axis) and thickness $L_C$ (along Z-axis) 0.5 mm has been used. Along Y-axis, the length (height) of the polarizer 4b is less than half of the height of the $YVO_4$ crystal 2 and the LN crystal 3. Moreover, the center of the light incident surface of the polarizer 4b is disposed lower (towards the negative Y-axis) than the center of the output surface of the LN crystal 3 and facing towards the LN crystal 3.

As shown in FIG. 3(b), the rear-facet output laser light A of the LD device 11 includes an optical path of light signals A1 that passes through the top part of the wavelength filter 13 and an optical path of light signals A2 that passes through the bottom part of the wavelength filter 13. However, the optical components placed on these two optical paths are different. That is, the light signals A1 at the top of the wavelength filter 13 become light signals D1 after passing only through the $YVO_4$ crystal 2 and the LN crystal 3, while the light signals A2 excluding the light signals A1 at the bottom of the wavelength filter 13 become light signals D2 after passing through the $YVO_4$ crystal 2, the LN crystal 3, and the polarizer 4b.

The rear-facet output light A of the LD device 11 is caused to have a wide angle along Y-axis with the help of the drum lens 12. The polarizer 4b is placed below the light signals that are widened by the wide angle drum lens 12. Consequently, the light is split into the top light and the bottom light according to whether or not the light that has passed through the complex-refractive-index crystals has passed through the polarizer 4b. By using such a simple structure, both the wavelength and the intensity of the light signals can be monitored.

The distance between each optical component that is bonded alternately to the holders 70a, 70b, and 70c is the same. That is, a distance dL1 between the output surface of the $YVO_4$ crystal 2 and the incident surface of the LN crystal 3 as well as a distance dL2 between the output surface of the LN crystal 3 and the incident surface of the polarizer 4b is 0.25 mm.

FIG. 4 illustrates a positional relationship between the orientation of the optical axis (the C-axis) and the A-axis of the $YVO_4$ crystal 2 or the LN crystal 3 (hereinafter, the $YVO_4$ crystal 2 and the LN crystal 3 will be generically referred to as a "complex-refractive-index crystal 300") and a bonding surface S. As shown in FIG. 4, the A-axis is oriented upward towards the right along the bonding surface S, while the C-axis is oriented upwards towards the left along the bonding surface S.

The bonding surface S is an area covering, along X-axis, a length T (non-bonded length T) or the length M from the side edge of the metal holder end (one end) on the side of the optical output facet of the complex-refractive-index crystal 300, and along Y-axis, a length N from the bottom edge of the metal holder end on the side of the optical output facet of the complex-refractive-index crystal 300. The bonding area S is the area where the complex-refractive-index crystal 300 is bonded to the holder 70a or 70b of the metal holder 17.

In other words, the complex-refractive-index crystal 300 is bonded to the metal holder 17 after a clearance of size of the non-bonded length T from the edge of the metal holder 17. The length N here is about 1.8 mm, the length M is about 0.6 mm, and the non-bonded length T is about 20 µm to 50 µm. In the case of the $YVO_4$ crystal 2, the side surface of the $YVO_4$ crystal 2 is attached to an attachment facet 70d of the metal holder 17.

On the other hand, the polarizer 4b, not being a complex-refractive-index crystal, does not have an optical axis. However, the polarizer 4b includes the bonding surface S that is bonded to the holder 70c of the metal holder 17 along X-axis up to the range which the length M covers from the farthest end (that is, in FIG. 4, the non-bonded length T=0) and is bonded to the holder 70c of the metal holder 17 along Y-axis from the top to the bottom of the metal holder 17 (that is, in FIG. 4, N=H).

Like the complex-refractive-index crystal 300, the polarizer 4b may also be bonded to the holder 70c of the metal holder 17 after a clearance of the non-bonded length T of about 20 µm to 50 µm from the edge of the metal holder 17.

According to such a structure, the portion other than the bonding surface S of the complex-refractive-index crystal 300 and the polarizer 4b constitutes an opening surface through which the light signals can pass.

Each optical component that constitutes the wavelength filter 13 is bonded to the metal holder 17 by soldering with an Au—Sn alloy. However, other soldering material such as an Au—Ag—Cu alloy, a Sn—Ag alloy, or a Sn—Pb alloy may also be used. Instead of a soldering material, a low melting-point glass may also be used.

Each optical component that constitutes the wavelength filter 13 may also be bonded to the metal holder 17 with an adhesive. However at times, the adhesive at the bonding portion gets peeled off due to the difference in the coefficient of linear expansion or an outgas is generated from the adhesive and gets adhered to the optical components inside the optical module, thus changing their refractive indices and the transmissivity. Hence, such a bonded structure should be applied only when no such problems occur.

Figure 5:
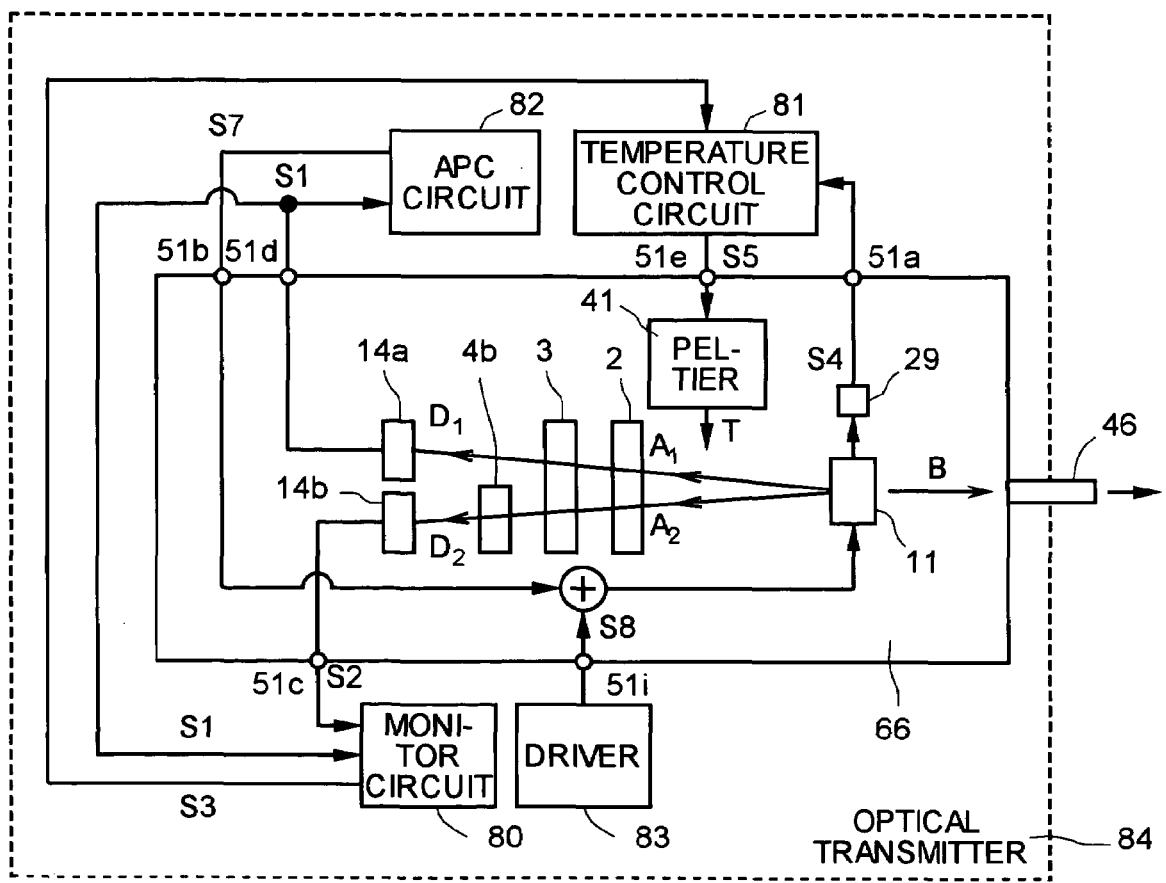
FIG. 5 is a block diagram representing layout of the optical transmitter according to the first embodiment of the present invention.

FIG. 5 illustrates a structure describing the flow of the optical path and the light signals of the wavelength monitor according to the first embodiment of the present invention. The reference numerals in FIG. 5 identical to those in FIG. 1 and FIG. 2 represent identical components.

An optical transmitter 84 is fabricated by mounting the optical module 66, a monitor circuit 80, a temperature control circuit 81, an automatic power control (APC) circuit 82 and a driver 83 on the not shown electronic circuit board and keeping the electronic circuit board into a not shown case. However, the optical transmitter is also called the optical module according to the present invention.

The monitor 80 is placed outside the optical module 66. Monitor signals S1 and S2 from the PD devices 14a and 14b are transmitted via the leads 51d and 51c. Based on the monitor signals S1 and S2, the monitor circuit 80 monitors the wavelength oscillation of the LD device 11 and the intensity of the output light. The temperature control circuit 81 outputs temperature control signals S5 to the peltier 41, based on wavelength monitor signals S3 output from the monitor circuit 80 and temperature monitor signals S4 output from the temperature detector 29. The automatic power control circuit 82 supplies, based on the monitor signals S1 from the PD device 14a, bias signals S7 to the LD device 11 such that the intensity of the output light of the LD device 11 becomes constant. The driver 83 supplies RF signals S8 to the LD device 11 and modulates the intensity of the output light of the LD device 11. The bias signals S7 are input into the LD device 11 by impressing the RF signals S8 on the bias signals S7. The automatic power control circuit 82 also includes a current source that generates the bias signals S7, which are supplied to the LD device 11.

The wavelength monitor, the optical module, and the optical transmitter according to the first embodiment of the present invention are fabricated as described above and operate as described below.

According to FIG. 1, FIG. 2, and FIG. 5, the RF signals are input from the driver 83 provided in the optical transmitter 84 into the optical module 66 via the lead 51i. The input RF signals are transmitted through the wire 64, the conductive track 22, the wire 19a, the conductive track 15b, and the wire 19b and are then fed to the LD device 11. The bias signals S7 that are output from the automatic power control circuit 82 provided in the optical transmitter 84 are input into the optical module 66 via the lead 51b and are then transmitted to the bias circuit 24 via the wire 61, the conductive pad 26, and the wire 25. The transmitted bias signals S7 pass through the wire 23, the conductive track 21b, the wire 19a, the conductive track 15b, and the wire 19b and are then fed to the LD device 11 along with the RF signals S8. The LD device 11 considers the supplied bias signals S7 as the bias and based on the RF signals S8 emits the laser light in order to modulate the intensity of the output light.

According to FIG. 1 and FIG. 3, the rear-facet output laser light A that is output due to the laser emission of the LD device 11 passes through the drum lens 12 and is incident on the $YVO_4$ crystal 2 of the wavelength filter 13. The light signals that have passed through the $YVO_4$ crystal 2 are further incident on the LN crystal 3. The polarization condition of the laser light A when passing through the complex-refractive-index crystals, namely, the $YVO_4$ crystal 2 and the LN crystal 3 changes. On the other hand, the change in the polarization condition due to the temperature change is suppressed.

A top portion of the light signals D1 of the light signals that have passed through the LN crystal 3 are transmitted to the PD device 14a without passing through the polarizer 4b. A bottom portion of the light signals D2 of the light signals that have passed through the LN crystal 3 are transmitted to the PD device 14b by passing through the polarizer 4b. The light signals D2 are those signals that pass through the polarizer 4b and have the light polarized only along Y-axis. The intensity Ip of the light signals D2 that have passed through the polarizer 4b is based on the expressions (1), (2), and (4) and is dependent on the oscillation wavelength λ of the LD device 11.

In other words, the PD device 14b receives the light signals D2 and the amount of the output current (monitor signals S2) output from the PD device 14b varies according to the intensity Ip of the light signals D2 that are dependent on the wavelength λ. On the other hand, the intensity of the light signals D1, which pass through an optical path deviated above the polarizer 4b, does not vary according to the wavelength because the light signals D1 do not pass through the polarizer 4b. As a result, when the PD device 14a receives the light signals d1, the amount of the output current (monitor signals S2) output from the PD device 14a varies according to the intensity I of the light signals D1.

Consequently, the intensity I of the light signals that are received into the PD device 14a is not dependent on the wavelength and the amount of the monitor signals S1 output from the PD device 14a varies according to the intensity of the output light of the LD device 11. In the monitor circuit 80, the monitor signals S2 are subtracted from the monitor signals S1 and a standardized intensity In, which is not dependent on the intensity of the output light of the LD device 11, is obtained. Hence, as shown in FIG. 14, within a usage slope range that is almost close to a straight line and includes a standard wavelength λ0, the wavelengths are uniquely determined from the standardized intensity In and the wavelength of the LD device 11 can be differentiated based on the value of S2/S1. At this time, the standardized intensity In is obtained by obtaining both the light intensity that is not dependent on the wavelength and the light intensity that is dependent on the wavelength from the top portion and the bottom portion of the signal light, respectively, that has passed through the $YVO_4$ crystal 2 and the LN crystal 3. Hence, the portion of the light signals that attenuates after passing through the $YVO_4$ crystal 2 and the LN crystal 3 is suppressed and thus the wavelength can be differentiated at a higher sensitivity. By monitoring the amount of the monitor signals S1 output from the PD device 14a, the intensity of the output light of the LD device 11 can be monitored.

While fabricating the wavelength filter 13, the size of each complex-refractive-index crystal 300 (the $YVO_4$ crystal 2 or the LN crystal 3) may be set to the size of only the bottom half, that is, same as the size of the polarizer 4b. The optical path of the light signals A may then be divided according to second light signals that have passed through both the complex-refractive-index crystal 300 and the polarizer 4b and first light signals that do not pass through both the complex-refractive-index crystal 300 and the polarizer 4b. However, in this case, it is necessary to precisely match the positions of the complex-refractive-index crystal 300 and the polarizer 4b in such a way that the light signals at the top that have passed through each of the two complex-refractive-index crystals are incident on the top of the polarizer, and the top of each complex-refractive-index crystal and the top of the polarizer match with the optical axis of an optical beam that passes through them. This matching of positions is a cumbersome job.

However, according to present first embodiment, in the wavelength filter 13 that comprises the complex-refractive-index crystal 300 and the polarizer 4b, the optical beam is not divided while passing through the complex-refractive-index crystal 300. The light signals are divided according to whether or not the optical beam passes through the polarizer 4b of the PD device 14. Hence, the complex-refractive-index crystal 300 is disposed in such a way that the optical beam passes through the opening of the complex-refractive-index crystal 300. Accordingly, the polarizer 4b is disposed in such a way that it falls within the opening of the optical beam that has passed through the complex-refractive-index crystal 300. Thus in this way, the mutual positions of the complex-refractive-index crystal 300 and the polarizer 4b need not be very precise.

The holders 70a, 70b, and 70c of the metal holder 11 provide a cantilever support to the complex-refractive-index crystal 300 and the polarizer 4b, which, constitute the wavelength filter 13, at their end in the horizontal direction (direction perpendicular to the X-axis). The bottom of the wavelength filter 13 is supported by the metal holder 17 close to the surface 16b of the carrier 16. The bottom of the opening surface of the wavelength filter 13 can be lowered and brought close to the carrier top surface 16b. As a result, the top of the wavelength filter can be raised and the height of the case 40, which includes the wavelength filter 13, can be reduced.

By serially placing the wavelength filter 13 on the optical path between the LD device 11 and the PD mount 11, the minimum required length can be obtained in the output direction from the LD device 11 to the PD mount 18.

That is, according to the present embodiment, there is no wastage of space as in the case of the prior art 1 in which the two PD devices that are placed on either side of the wavelength filter are serially placed in the output direction of the LD device, or in the case of the prior arts 2 and 3 in which the output direction of the LD device is split into two in the perpendicular direction by the beam splitter and the output light split into two is incident on the two PD devices, respectively, that are placed on either side of the output direction of the LD device.

In addition to that, by placing on either or both sides of the optical path of the light signals A the power supply board 20 that supplies the RF signals or the bias signals to the LD device 11 or the temperature detector 29, the optical module can be fabricated in a more compact manner.

Moreover, the temperature detector 29 can precisely measure the temperature of the LD device 11 because the temperature detector 29 and the LD device 11 are disposed next to each other on the surface 16a, which is a step higher than the surface 16b on which the components such as the wavelength filter 13, the power supply board 20, and the PD mount 18 are disposed.

The intensity of the light received by the PD device 14 increases by convergence of the rear-facet output light of the LD device 11 along X-axis by means of the drum lens 12 and the intensity of the light signals D1 and D2 can be increased against the noise generated due to the surrounding reflecting light. The wavelength-differentiation precision of the wavelengths can be improved. Thus a better wavelength monitor can be obtained. However, a structure in which no drum lens 12 is employed may also be considered according to the desired precision necessary for differentiating the wavelengths.

A control operation carried out in order to stabilize the wavelength of the LD device 11 is explained next. When the monitor signals Si of the PD device 14a and the monitor signals S2 of the PD device 14b are input into the monitor circuit 80, the monitor circuit 80 divides the monitor signals S2 of the PD device 14b by the monitor signals S1 of the PD device 14a and measures a signals intensity ratio Pr=S2/S1 (the signals intensity ratio Pr is proportionate to the standardized intensity In). For the sake of convenience in the following description, the values of Pr and In are considered to be equal (that is, Pr=In).

The monitor circuit 80 calculates a difference ΔP between the measured signals intensity ratio Pr and a predetermined signals intensity ratio $P_0$. According to the comparison between the values of Pr and $P_0$, the monitor circuit determines whether the light signals output from the LD device 11 are shifted towards a short-wavelength end or a long-wavelength end with respect to the standard wavelength λ0.

Basically, at the time of taking a trial, while adjusting the current applied to the peltier 41, the wavelength of the front-facet light signals of the LD device 11 and output from the optical fiber 46 is measured by a wavelength-measuring device such as a Fabry-Perot resonator, etc. When that measured wavelength becomes equal to the desired standard wavelength λ0, the value of $P_0$ is set in such a way that the value of ΔP becomes zero. The wavelength filter 13 is fabricated in such a way that the value of the standard wavelength λ0 falls within the usage slope range shown in FIG. 15.

Accordingly, when the oscillation wavelength λ of the LD device 11 falls within the usage slope range, if the value of ΔP measured by the monitor circuit becomes negative, the oscillation wavelength λ can be considered to be shifted towards the long-wavelength end with respect to the standard wavelength λ0 and if the value of ΔP becomes positive, the oscillation wavelength λ can be considered to be shifted towards the short-wavelength end with respect to the standard wavelength λ0.

The value of ΔP calculated by the monitor circuit 80 is input as the wavelength monitor signals S3 into the temperature control circuit 81. The temperature control circuit 81 adjusts, based on the wavelength monitor signals S3 input from the monitor circuit 80, a control target temperature Tm. In general, the wavelength of the LD device varies according to the temperature. Hence, when the temperature is increased, the oscillation wavelength becomes longer and when the temperature is reduced, the oscillation wavelength becomes shorter.

On the other hand, when the oscillation wavelength λ is shifted towards the long-wavelength end, the value of ΔP output from the monitor circuit 80 becomes negative and when the oscillation wavelength λ is shifted towards the short-wavelength end, the value of ΔP becomes positive. As a result, a specific gain constant G is multiplied to the value of ΔP and the result is added to an initial control target temperature $T_0$ such that the control target temperature Tm is set as Tm=$T_0$+GΔP. Thus, the oscillation wavelength of the LD device 11 can be stabilized.

The temperature detector 29 detects the temperature of the surface 16a of the carrier 16. Consequently, when the oscillation wavelength of the LD device 11 becomes equal to the standard wavelength λ0, the temperature detected by the temperature detector 29 is set beforehand to the initial control target temperature $T_0$.

The temperature control circuit 81 adjusts, based on the output signals S4 of the temperature detector 29, the amount of the current applied to peltier 41 such that the temperature of the LD device 11 becomes equal to the control target temperature Tm. The temperature control circuit 81 controls the temperature of the LD device by cooling or heating the LD mount 15 on which the LD device 11 is mounted and the carrier 16. To be more specific, the temperature control circuit 81 adjusts the amount of the current applied to peltier 41 such that a difference ΔT between a detected temperature T of the temperature detector and the control target temperature Tm becomes 0 or less than a target deviation e.

The automatic power control circuit 82 controls, based on the monitor signals S1 of the PD device 14, the output light of the LD device 11 to a specific intensity. To be more specific, the automatic power control circuit 82 stores beforehand as $S1_0$ the monitor signals S1 at the time when the light signals output from the LD device 11 become equal to the standard wavelength λ0. When the temperature control circuit 81 and the LD device 11 are under operation, the automatic power control circuit 82 obtains the difference between the monitor signals S1 of the PD device 14a and $S1_0$ and adjusts the amount of current that supplies the bias signals S7 to the LD device 11 such that there is no difference between the monitor signals S1 of the PD device 14a and $S1_0$.

The wavelength monitor, the optical module, and the optical transmitter according to the first embodiment of the present invention work as described above and accordingly the wavelength oscillation and the optical output intensity of the LD device 11 can be maintained. stable.

The wavelength filter, which includes plural optical components fabricated from the complex-refractive-index crystal and the polarizer, and the PD device, which measures the amount of the output light of the LD device and the amount of the light passing through the wavelength filter, are placed inside the optical module in such a way that the area occupied by the wavelength filter or the PD device is as small as possible. Accordingly, an optical module in which a larger space is available in order to fix components other than the wavelength filter or the PD devices can be obtained.

When fabricating an optical module, which obtains a signal light of a specific wavelength at a specific intensity without supplying modulation signals to the LD device 11, the driver 83 and the signals supplied from the driver 83 are removed, as shown in FIG. 5. The remaining operation is the same as described above, except in this case the signal light of a constant intensity is output from the LD device 11.

The complex-refractive-index crystal 300 gets distorted when soldered to the metal holder 17 due to the strain caused by the residual stress of the complex-refractive-index crystal 300. The refractive index varies from the junction across the longitudinal direction of the crystal because of an electro-optical effect and a photo-elastic effect. As the variation in the refractive index causes the wavelength-differentiation characteristic of the wavelength filter to deteriorate, it is necessary to pass the laser light that monitors the wavelength through a region where the variation in the refractive index is less.

One end of the complex-refractive-index crystal 300 according to the first embodiment of the present invention is provided a cantilever support by the metal holder 17. As the other end of the complex-refractive-index crystal 300 is not mechanically bonded to anything, the effect of an internal stress from the junction towards the X-axis of the complex-refractive-index crystal 300 decreases. As a result the length of the wavelength filter 13 along X-axis can be shortened. This has been described in detail in the following paragraphs.

Figure 6:
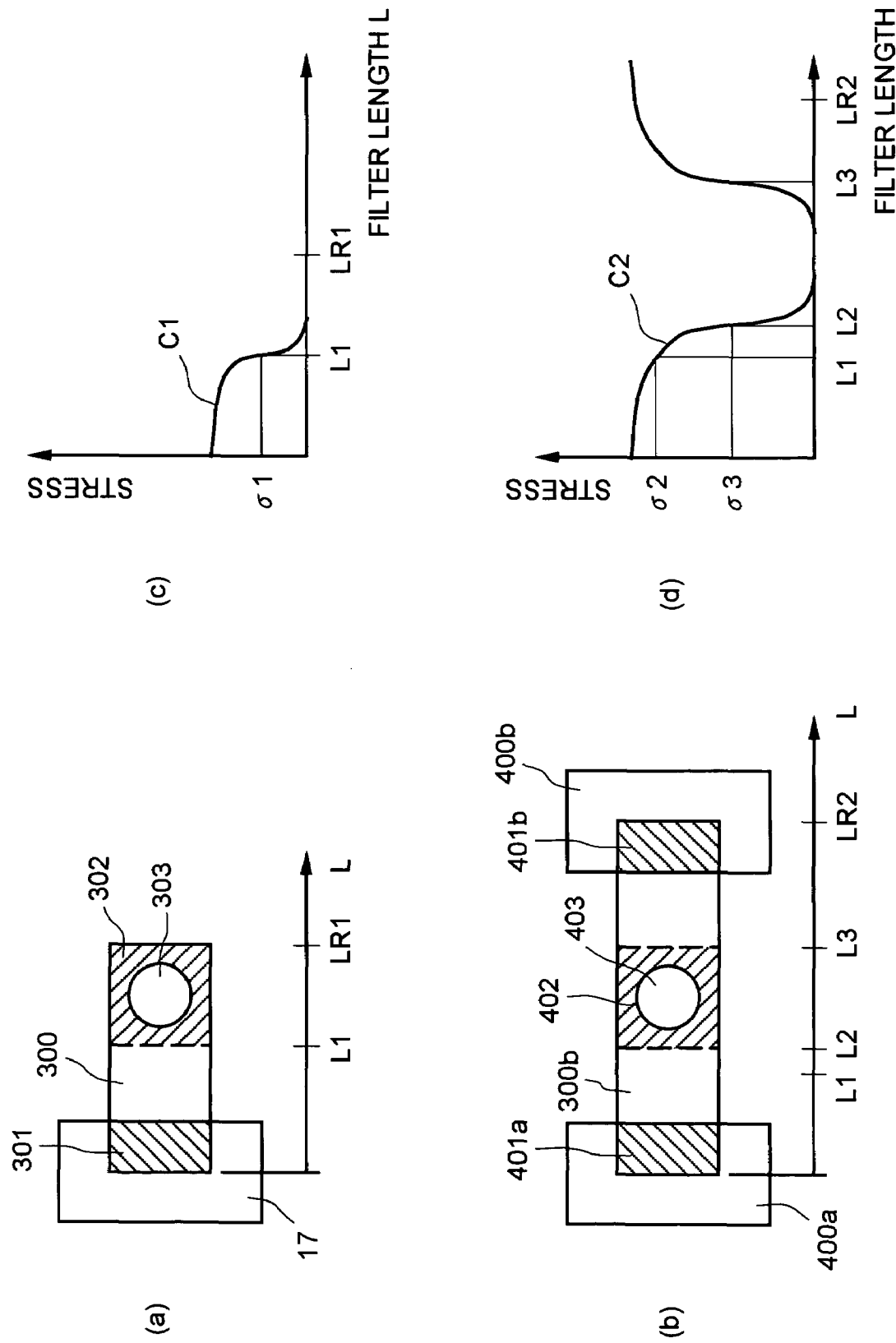
FIG. 6 illustrates comparison between the case in which the wavelength filter is supported at one side and the case in which the wavelength filter is supported at both sides.

FIG. 6(a) qualitatively illustrates the stress distribution when the complex-refractive-index crystal 300 is provided a cantilever support and FIG. 6(b) qualitatively illustrates the stress distribution when the complex-refractive-index crystal 300 is provided a support at both ends.

In FIG. 6(a) and FIG. 6(b), L is a position on the X-axis of the complex-refractive-index crystal with reference to the farthest end of the junction of the metal holder.

In FIG. 6(a), the reference numeral 301 indicates the junction of the complex-refractive-index crystal 300. The reference numeral 302 indicates a region in which the internal stress of the complex-refractive-index crystal 300 becomes less than the half-value ($\sigma1$). LR1 is the free end (right end in FIG. 6(a)) of the complex-refractive-index crystal 300.

In FIG. 6(b), the reference numeral 300b indicates a complex-refractive-index crystal that has identical material and thickness as that of the complex-refractive-index crystal 300 but different length along the L direction. The reference numeral 400a indicates a metal holder that supports one end (left end in FIG. 6(b)) of the complex-refractive-index crystal 300b. The reference numeral 400b indicates a metal holder that supports the other end (right end in FIG. 6(b)) of the complex-refractive-index crystal 300b. The reference numeral 401a indicates a junction of the complex-refractive-index crystal 300b and the metal holder 400a, while the reference numeral 401b indicates a junction of the complex-refractive-index crystal 300b and the metal holder 400b. The reference numeral 402 indicates a region in which the internal stress of the complex-refractive-index crystal 300b becomes less than the half ($\sigma3$). LR2 is the right end of the complex-refractive-index crystal 300b.

FIG. 6(c) illustrates the stress distribution along the longitudinal direction (L direction) of the complex-refractive-index crystal 300 when the complex-refractive-index crystal 300 is provided a cantilever support. FIG. 6(d) illustrates the stress distribution along the longitudinal direction (L direction) of the complex-refractive-index crystal 300b when the complex-refractive-index crystal 300b is provided a support at both ends.

It is assumed here that the complex-refractive-index crystal 300 is provided a cantilever support and L1 is a length from the junction 301 to the left end of the region 302, as shown in FIG. 6(c). Similarly, in the complex-refractive-index crystal 300b, which is provided a support at both ends, the length from the junction 401 to the left end of the region 402 is L2 and to the right end of the region 402 is L3, as shown in FIG. 6(d). Therefore, the distance up to the region where the internal stress is less than the half-value of the internal stress shown in FIG. 6(c) increases (that is, L2>L1).

In the complex-refractive-index crystal 300b, the internal stress $\sigma2$ at the position L1 is greater than $\sigma1$. The half-value of the internal stress $\sigma3$ also is greater than the internal stress $\sigma1$. Consequently, when the complex-refractive-index crystal is provided a cantilever support, the length up to the position where the effect of the internal stress is less decreases, as compared to when the complex-refractive-index crystal is supported at both ends. Thus, the region in which the variation in the refractive index is more can be reduced.

As a result, a sufficiently large area with a more or less uniform refractive index can be ensured through which the laser light can pass so as to obtain the desired wavelength differentiation characteristics. Apart from that, the length along X-axis can be shortened as compared to the case in which both the ends are supported (that is LR1<LR2). In other words, the size of the wavelength filter and the support structure can be reduced.

In the Japanese Patent Laid-Open Publication No. 2001-291928, a structure is disclosed that supports the wavelength filter around the margins of an opening provided in the component (PD carrier). However, this support structure is similar to a structure in which both the ends are provided a support and does not have the advantages of the first embodiment of the present invention, namely, reduced size of the wavelength filter and the support structure while maintaining a sufficient passage area for the light signals.

FIG. 7(a) and FIG. 7(b) illustrate the result of an experiment in which the amount of variation in the wavelength is examined with respect to a position (left end of FIG. 7(a)) at 1600 μm from a junction S (hatching part of FIG. 7(a)) of the wavelength filter 13 at room temperature. The experiment was carried out in order to measure the variation in the wavelength caused while bonding the wavelength filter 13 to the metal holder 17. FIG. 7(a) illustrates the coordinates of a measuring position Q of the LN crystal used for the experiment. FIG. 7(b) illustrates the amount of variation in the wavelength in the region from the junction S of the wavelength filter 13 up to a length of 1600 μm.

In FIG. 7(a), the reference numeral 305 indicates an area through which the laser beam passes. The wavelength filter used in this experiment is fabricated from the YVO$_4$ crystal 2, the LN crystal 3 and the polarizer 4, identical to the first embodiment of the present invention. The laser light source has an aperture of 600 μm and a wavelength in the range of 1520 μm to 1620 μm, and is placed facing towards the YVO$_4$ crystal 2. A wavelength λ is measured when the position Q of the optical axis of the laser light source is shifted in a range of −600 μm to 600 μm.

The vertical axis of FIG. 7(b) indicates an amount of variation Δλ in the wavelength of the laser light that has passed through the wavelength filter 13, with reference to the wavelength λ measured at the position Q=0 as the origin. According to this result, it was evident that the wavelength goes on gradually increasing towards the junction S.

It was confirmed that in the range of −600 μm to 600 μm, the amount of variation in the wavelength can be suppressed to about 40 pm. If the amount of variation in the wavelength is suppressed to this extent, this structure can well be considered as a wavelength monitor that stabilizes the wavelength of an optical module. That is, it was confirmed that when a cantilever support structure is provided, the effect of the internal stress on the junction does not pose that big a problem.

In order to further reduce the residual stress caused while bonding the wavelength filter 13 to the metal holder 17, it is necessary to choose a material of better quality for the metal holder 17.

Figure 8:
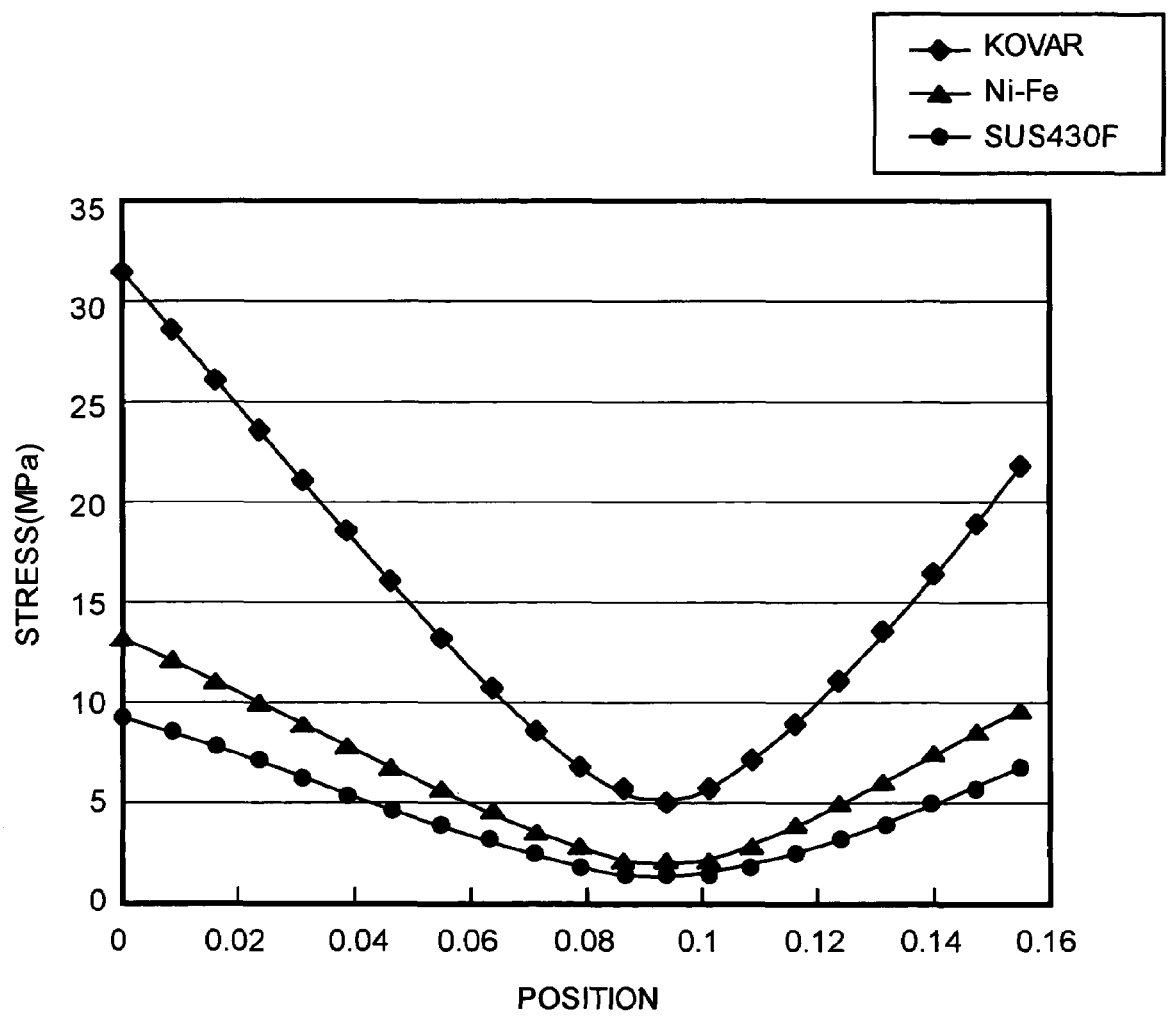
FIG. 8 is a graph representing relation between the metal holder material and stress of the junction surface.

FIG. 8 illustrates the calculation result of the internal stress generated at the junction S and distributed in the direction of the board thickness when the LN crystal is bonded to the metal holder using different materials. In FIG. 8, the vertical axis indicates the internal stress and the horizontal direction indicates the position along the direction of the board thickness wherein the center of the board thickness is set to zero. The graph in FIG. 8 illustrates from top, respectively, the calculation result of the internal stress when Kovar (product name), a Ni—Fe alloy (Ni 50%, Fe 50%), and SUS430F is used. The coefficient of linear expansion of Kovar is in the range of 7.6 to 6.2 [1/° C.], the coefficient of linear expansion of a Ni—Fe alloy is in the range of 9/4 to 10.0 [1/° C.], and the coefficient of linear expansion of SUS430F is about 10.3 [1/° C.].

It is clear from FIG. 8 when a Ni—Fe alloy and SUS430F is used, the internal stress is about one third the internal stress when Kovar is used. The stress distribution also decreases when a Ni—Fe alloy and SUS430F is used. According to this result and by considering the availability and the workability factors, it can be concluded that it is better to use SUS430F.

According to the above description, by surface-bonding only one side surface of the wavelength filter to the holders of the metal holder, a small-size wavelength filter can be obtained in which the internal stress caused while bonding the wavelength filter to the metal holder is reduced. Consequently, a wavelength monitor can be obtained in which the optical characteristics of the wavelength filter are less deteriorated.

A bonding structure between the complex-refractive-index crystal 300 (the YVO$_4$ crystal 2 and the LN crystal 3), the polarizer 4b, and the holders of the metal holder 17 is explained next.

FIG. 9(a), FIG. 9(b), and FIG. 9(c) illustrate the details of a bonding structure between the complex-refractive-index crystal 300 and the holders of the metal holder 17 that constitute the wavelength filter according to the first embodiment of the present invention. FIG. 9(a) illustrates a bonding structure between the complex-refractive-index crystal 300 (or the polarizer 4b) and the metal holder 17 according to the first embodiment of the present invention. FIG. 9(b) is a structure that illustrates another bonding structure in order to compare with the bonding structure shown in FIG. 9(a). FIG. 9(c) illustrates a structure of a variation of the bonding according to the first embodiment of the present invention.

In FIG. 9(a), the reference numeral 601 indicates a metalized layer obtained by stacking plural layers of metals. The reference numeral 602 indicates a solder. The processes from laminating the complex-refractive-index crystal 300 (or the polarizer 4b) with the metalized layer 601 up to the soldering of the complex-refractive-index crystal are explained next.

In the YVO$_4$ crystal 2, the LN crystal 3, and the polarizer 4b, the region covering from the edge of one end along X-axis up to M μm is coated with a chromium layer by depositing chromium (Cr) until a coating thickness of 0.05 μm is obtained. A nickel layer is coated over the chromium layer by depositing nickel (Ni) until a coating thickness of 0.1 μm is obtained. A gold layer is coated over the nickel layer by depositing gold (Au) until the coating thickness becomes 0.5 μm. Each metalized layer 601 is thus fabricated by stacking these three layers, namely the chromium layer, the nickel layer and the gold layer.

With reference to FIG. 4, a metalized layer 601 is fabricated along the edge of the end mentioned above (along Y-axis) covering the length H from the top edge to the bottom edge of the YVO$_4$ crystal 2, the LN crystal 3, and the polarizer 4b, respectively. The metalized layer 601 may also be fabricated by using a combination of layers of Ti—Ni—Au, instead of Cr—Ni—Au.

Electrolytic plating is carried out in the metal holder 17. First, nickel (Ni) plating is carried out until a coating thickness of 5.0 μm is obtained. Next, gold (Au) plating is carried out until the coating thickness becomes 1.0 μm. Thus, the bonding surface S of each of the holders 70a, 70b, and 70c of the metal holder 17 can be easily bonded by using the solder 602 made of an Au—Sn alloy.

The coating thickness or the metal used for the plating need not be confined only to those described above and may be appropriately chosen by considering the bonding strength, etc. of the metal holder. The solder 602 may also be made of alloys of other base metals such as a Pb—Sn alloy.

The solder 602 that has a width of (M-T) μm is disposed on the bonding surface S of each of the holders 70a, 70b, and 70c of the metal holder 17. The YVO$_4$ crystal 2, the LN crystal 3, and the polarizer 4b are then mounted above the respective solder 602. That is, the YVO$_4$ crystal 2, the LN crystal 3, and the polarizer 4b are mounted above the bonding surface S of the respective holders 70a, 70b, and 70c.

A weight is put over the YVO$_4$ crystal 2, the LN crystal 3, and the polarizer 4b such that the bonding surface is clamped down and each optical component that constitutes the wavelength filter is temporarily supported. The YVO$_4$ crystal 2, the LN crystal 3, and the polarizer 4b are not yet bonded to the respective holders 70a, 70b, and 70c. Along the edge of the holders of the metal holder 17 (along Y-axis), the height of the solder that bonds the YVO$_4$ crystal 2 and the LN crystal 3 is the same as the height of the holders, that is, the same as the length N.

There is provided a clearance U from the edge of the YVO$_4$ crystal 2, the LN crystal 3, and the polarizer 4b up to a distance of T where no solder 602 is present. The clearance U is disposed between the vicinity of the edge of the bonding surface S of the YVO$_4$ crystal 2, the LN crystal 3, and the polarizer 4b and the metal holder 17.

The solder 602 is then heated and molten in a reflow furnace under a reflow condition of 300° C. for 10 minutes. Consequently, the edge of the YVO$_4$ crystal 2, the LN crystal 3, and the polarizer 4b, respectively, is bonded to the bonding surface S of the holders 70a, 70b, and 70c of the metal holder, with the clearance U forming a non-bonded portion.

In the course of the experiment, it was discovered that after the complex-refractive-index crystal 300 (the YVO$_4$ crystal 2 or the LN crystal 3) is bonded to the metal holder 17, cracks appear in the edges of the complex-refractive-index crystal 300 according to the length of the clearance U (the non-bonded length T).

As shown in FIG. 9(b), a solder 603 was placed up to the edge of the complex-refractive-index crystal 300. In this state, that is, when there is no clearance U (the non-bonded length T=0), the complex-refractive-index crystal 300 was soldered to the metal holder 17 by heating in the reflow furnace. While the solder 603 cooled down to room temperature, defects such as cracks, etc. appeared in the complex-refractive-index crystal after bonding.

This lead to carrying out of a heating-cooling experiment from which it became clear that there is a 90% chance of cracks appearing in the complex-refractive-index crystal. Even when the clearance U was kept small and the non-bonded length T was 10 µm, there was still a 50% chance of cracks appearing in the complex-refractive-index crystal after bonding.

This heating-cooling experiment was carried out on 100 test pieces that were prepared in order to bond the complex-refractive-index crystal 300 to the metal holder 17 and involved repeated cycles of cooling the test pieces to −40° C. for 30 minutes and heating to +85° C. for 30 minutes.

In a complex-refractive-index crystal that has a cut edge, this defect may be caused because of fine cracks or distortions caused by cutting.

In other words, when soldering is carried out by employing the reflow furnace, distortions caused due to the heat stress appear in the soldering portion. Each time the cooling and the heating process is repeated, these distortions expand the fine cracks or the distortions in the complex-refractive-index crystal. It was supposed that the fine cracks and distortions grew and eventually gave rise to larger cracks.

When the clearance U from the edge to the junction is small and in the range of 10 µm, the cracks appear as before due to the heat stress in the soldering region.

On the other hand, when the clearance U was increased and the non-bonded length T was made 20 µm or greater, the percentage of the cracks appearing according to the heating-cooling experiment was almost negligible at 5%. When the non-bonded length T was in the range of 30 µm~50 µm, the cracks did not appear at all.

Thus the distortions that appear due to the heat stress can be effectively prevented if the complex-refractive-index crystal is bonded to the metal holder when the non-bonded portion, that is, the clearance U is offset from the edge by 20 m µm or above.

In other words, even if fine cracks are present in the non-bonded portion, the heat stress does not have much of an effect, as the whole region from the edge of the complex-refractive-index crystal up to the 20 µm or above is a non-bonded portion that is not bonded to the metal holder.

In the case of the polarizer 4b, even if the polarizer 4b is bonded to the holder 70c of the metal holder 17 without the clearance U, that is, with the non-bonded length T being zero, no cracks appeared.

Figure 9:
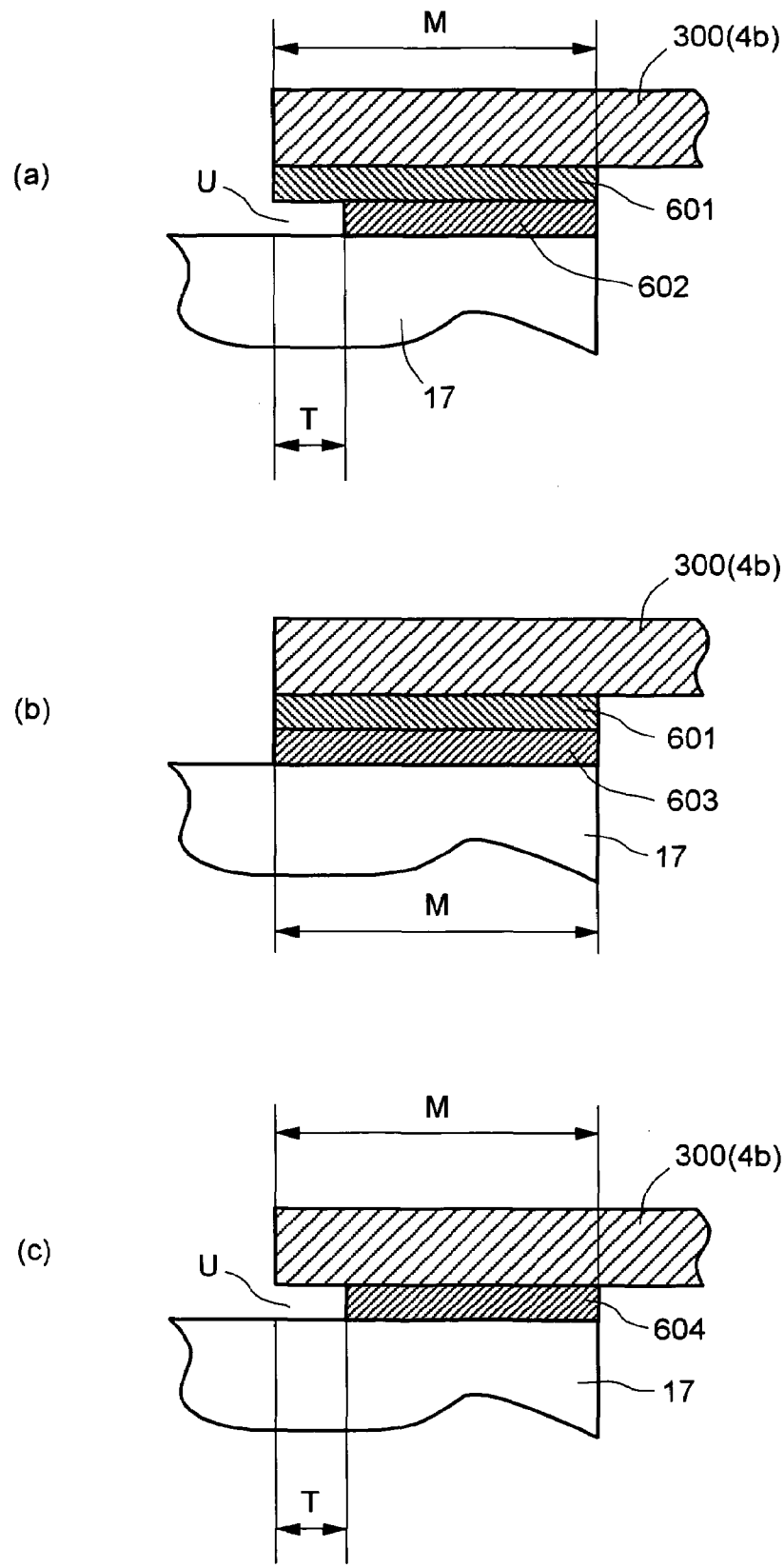
FIG. 9 is a schematic diagram of the junction structure between the metal holder and the complex-refractive-index crystal.

FIG. 9(*c*) illustrates a variation of the bonding structure of the complex-refractive-index crystal.

In order to prevent corrosion, electrolytic plating is carried out in the holders 70a, 70b, and 70c of the metal holder 17. Nickel (Ni) plating is carried out until a coating thickness of 5.0 µm is obtained, after which gold (Au) plating is carried out until the coating thickness becomes 1.0 µm.

In order to prevent corrosion, electrolytic plating is carried out in the holders 70a, 70b, and 70c of the metal holder 17. After carrying out nickel (Ni) plating till the coating thickness becomes 5.0 µm, gold (Au) plating is carried out till the coating thickness becomes 1.0 µm.

The coating thickness or the metal used for the plating is not confined only to the above description and may be appropriately chosen by considering the corrosion resistance of the metal holder. When the metal holder is made of a stainless metal, the surface of the metal holder may be passivated, thereby avoiding the plating process completely.

The process of bonding by a low melting-point glass is explained in detail next.

The YVO$_4$ crystal 2, the LN crystal 3, and the polarizer 4b are mounted on the bonding surface of the holders 70a, 70b, and 70c, respectively, such that the holders are placed below the optical components. A laminated PbO low melting-point glass 604 that has a width of (M-T) µm is disposed between each of the holders 70a, 70b, and 70c of the metal holder 17 and each optical component. The PbO low melting-point glass 604 is disposed in such a way that no PbO low melting-point glass 604 exists in the region from the edge of the optical component to the length T µm. Along the edge of the protrusion of the metal holder 17 (along Y-axis), the height of the laminated PbO low melting-point glass 604 is the same as the height of the protrusion of the metal holder 17, that is, the same as the length N.

The low melting-point glass 604 is then heated and molten in a reflow furnace under a reflow condition of 280° C. for 10 minutes. Consequently, the edge of the YVO$_4$ crystal 2, the LN crystal 3, and the polarizer 4b, respectively, is bonded to the bonding surface S of the holders 70a, 70b, and 70c of the metal holder 17, with the clearance U forming a non-bonded portion.

Similar to the case of soldering as described above, the heat stress does not have much of an effect on the non-bonded portion if the complex-refractive-index crystal is bonded to the metal holder when the non-bonded portion, that is, the clearance U is offset from the edge by 20 µm or above.

According to the above description, when the optical components are bonded to the metal holder, the cracks in the optical components caused due to the heat stress can be effectively prevented by providing a non-bonded portion U, which is not bonded to the metal holder, in the region from the edge of the complex-refractive-index crystal up to a length of 20 µm or more.

Figure 10:
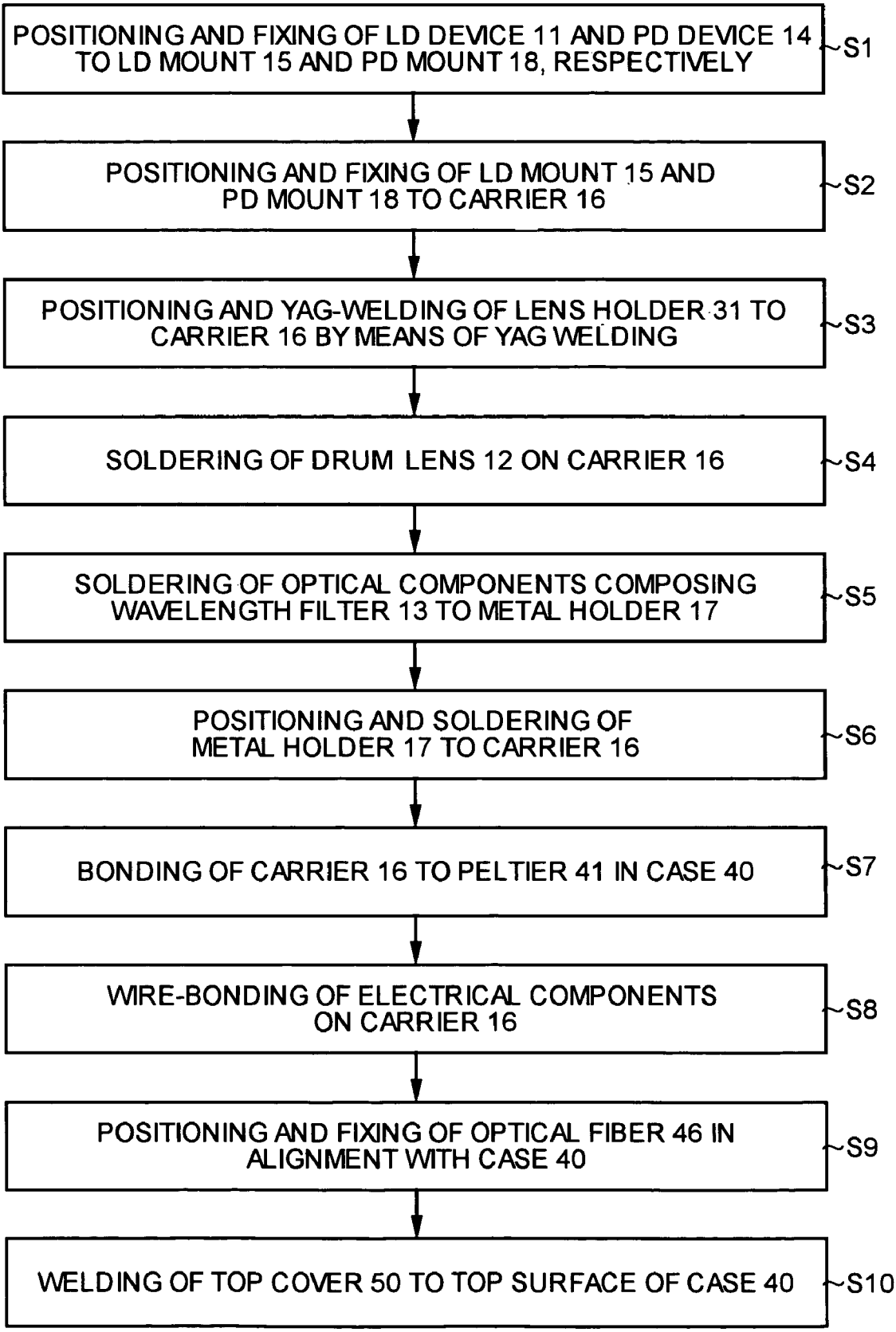
FIG. 10 is a flowchart of packaging process of the optical module according to the first embodiment of the present invention.

The process of assembling the optical module according to the first embodiment of the present invention is explained next with reference to FIG. 10.

Using a microscope or a camera screen, the LD device 11 and the PD device 14 are accurately mounted on and soldered to the LD mount 15 and the PD mount 18, respectively (Step S1).

The LD mount 15 and the PD mount 18 are accurately arranged on and soldered to the carrier 16 (Step S2), again while viewing under a microscope or on a camera screen.

While monitoring the front-facet output light signals of the LD device 11, the lens holder 31 that supports the lens 30 is clamped on to the front surface of the carrier 16 and moved from side to side and up and down. The light that has passed through the lens 30 is monitored at the same time and the lens holder 31 is bonded to the carrier 16 by means of YAG welding at a position where the intensity of the monitored light becomes the maximum (Step S3).

The drum lens 12 is clamped on to the attachment facets 33a and 33b of the carrier 16 and soldered to the surface 16b (Step S4).

Each optical component that constitutes the wavelength filter 13 is aligned while viewing through a microscope and soldered to the metal holder 17 (Step S5).

The metal holder 17 that is bonded to the wavelength filter 13 is clamped on to the attachment facets 32a and 33c of the carrier 16 and bonded to the surface 16b by means of YAG welding (Step S6).

The peltier 41 is placed in the case 40 and the carrier 16 is bonded to the peltier 41 (Step S7). The feed-through 42 or the lead 51 are already bonded to the case 40.

Wiring is laid in the case 40 and each wire is bonded to each component on the carrier 16 (step S8).

After fixing the components that constitute the front-facet optical system in the optical interface 65 to the respective supporting holders, the lens holder 45 is bonded in the case 40 by means of YAG welding. While monitoring the intensity of the signals that are output from the LD device 11 and that connect with the optical fiber 46 to be output from the other end of the optical fiber 46, the ferrule 46*b* is aligned with the ferrule holder 47 along the optical axis such that the intensity of the signals is optimum. After aligning the ferrule holder 47 perpendicularly with respect to the lens holder 45, the ferrule holder 47 and the ferrule 46*b* are bonded by means of YAG welding. After again aligning the ferrule holder 47 perpendicularly with respect to the lens holder 45, the optical fiber 46 is fixed to the case 40 by bonding the ferrule holder 47 and the lens holder 45 by means of YAG welding (Step S9).

Finally, the top cover 50 is welded on to the top surface of the case 40 (Step S10).

When the optical module is assembled in this way, each optical component and the PD device that monitors the wavelength is disposed in such a way that the front-facet output light of the LD device can effectively connect with the optical fiber and the amount of the rear-facet output light of the LD device received in a photodetector is optimum. Also, this assembly of optical components and the PD device that monitors the wavelength gives good operating efficiency.

To sum up, according to the first embodiment of the present invention, the output light of the LD device 11 is passed through the wavelength filter 13 that is bonded at one end to the protruding holders provided in the metal holder 17. The light transmitted from the wavelength filter 13 is monitored by the PD device 14. By this, the deterioration of the optical characteristics in the wavelength filter 13 can be considerably reduced and the oscillation wavelength of the LD device 11 can be maintained at a stable level.

The area required for placing the wavelength filter 13 reduces by bonding the wavelength filter 13, which is fabricated from the complex-refractive-index crystal 300 and the polarizer 4*b*, to the metal holder 17, which has plural protrusions.

The area required for placing the wavelength filter 13 and the PD device 14 reduces by placing the wavelength filter 13 between the first photodiode 14*a* and the second photodiode 14*b*, which measure the amount of the output light of the LD device 11 and the amount of the transmitted light of the wavelength filter 13, and the LD device 11. As a result, it is possible to make a larger space available in order to fix, in addition to the wavelength filter 13 or the PD device 14, other electronic components such as the power supply board 20 and the temperature detector 29 inside the optical module.

The wavelength filter 13 is bonded to the metal holder 17 by leaving a clearance between an edge of one end of the wavelength filter and the metal holder 17. Hence, when the complex-refractive-index crystal 300 that constitutes the wavelength filter 13 is bonded to the metal holder 17, a bonding structure can be obtained in which no cracks appear in the complex-refractive-index crystal 300 and the complex-refractive-index crystal 300 is thus not damaged.

The dimensions of the metal holder according to the first embodiment of the present invention are comparatively small about 3 mm wide, 2 mm long and 1.88 mm high. The wavelength filter 13 that is about 2.5 mm long is fixed to the protrusions on the side surface of the metal holder. As a result, when the metal holder is placed upright on the carrier, there is no stability. Unless an adjustment in the position of the metal holder is carried out securely holding it down, there is a possibility of the metal holder tipping over and the front end of the wavelength filter making contact with the surface 16*b*, resulting in poor workability. Hence, a second embodiment is offered in which a more workable structure for placing the metal holder according to the first embodiment on the carrier and an assembling method are disclosed.

FIG. 11(*a*) is a top view of a metal holder according to the second embodiment of the present invention. In FIG. 11(*a*), a metal holder 700 includes holders 70*a*, 70*b*, and 70*c* identical to the first embodiment of the present invention.

A projection 700*c* is provided that protrudes from a side surface 700*b*, which is disposed on the opposite side (top side of FIG. 11(*a*)) of the holders 70*a*, 70*b*, and 70*c* that support the wavelength filter 13. A keyhole-shaped slit is provided in the projection 700*c*. A feed-through slot 700*d* cuts the projection 700*c* vertically (along Y-axis).

The bonding structure of optical components 2, 3, and 4*b* that constitute the wavelength filter 13 and the metal holder 700, or the support structure and the operation involved in mounting the metal holder 700 on a wavelength monitor, an optical module or an optical transmitter is identical to the first embodiment of the present invention.

The operation of mounting on the carrier 16 the metal holder 700 to which the wavelength filter 13 is bonded is explained next.

The metal holder 700 is supported and held by inserting a rod-like tool in the feed-through slot 700*d* of the metal holder 700 As shown in FIG. 11(*b*), the metal holder 700 is maneuvered back and forth (along XX direction) and sideways (along ZZ direction) on the carrier 16 with the help of the rod-like tool such that the metal holder 700 is brought close to the attachment facets 32*a* and 33*c* (Step S100).

When the metal holder 700 is brought close to the attachment facets 32*a* and 33*c*, the rod-like tool is shifted back and forth and sideways, and fine adjustment is done such that the metal holder 700 touches the attachment facets 32*a* and 33*c*. The metal holder 700 is then bonded to the attachment facets 32*a* and 33*c* by means of YAG welding (Step S101).

In this way, by providing a feed-through slot in the metal holder 700 in which the rod-like tool is inserted, the metal holder 700 can be effectively attached to the attachment facets 32*a* and 33*c* on the carrier 16 on which all the optical components and boards are mounted. A stable support can be provided to the small metal holder by using the rod-like tool. Hence, any damage to the wavelength filter due to the metal holder tipping over can be prevented while the operation is underway.

The horizontal cross-section (cross-section parallel to the XZ plane) of the metal holder 700 is of the same shape from top to bottom (that is, along the Y axis). Consequently, the process of cutting by introducing a cutter from the top becomes easier. Further, the process of wire-cut electric discharge machining can be easily carried out by supplying power to the wires distributed vertically.

A third embodiment according to the present invention relates to a variation of the metal holder according to the first embodiment of the present invention.

Figure 12:
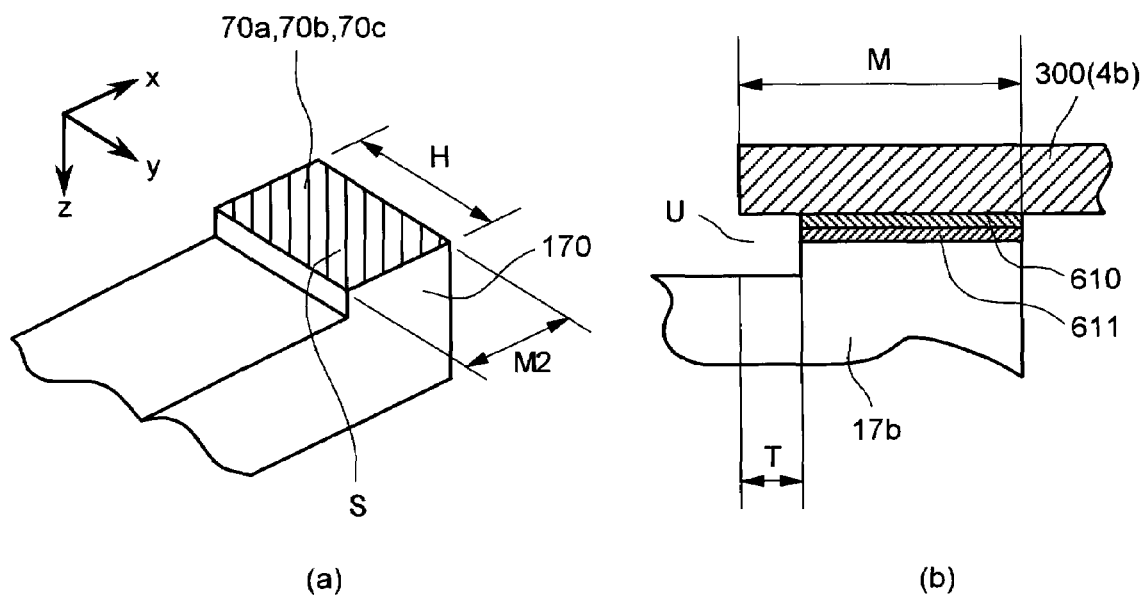
FIG. 12 a schematic diagram of the metal holder according to a third embodiment of the present invention.

FIG. 12(*a*) and FIG. 12(*b*) illustrate holders of a metal holder according to the third embodiment of the present invention. As shown in FIG. 12(*a*), the bonding surface S of the front ends of the holders 70*a*, 70*b*, and 70*c* of a metal holder 17*b* project in the direction of each optical component (the YVO4 crystal, the LN crystal 3, and the polarizer 4b) to form a projection 170. The projection 170 has a height H along the Y-axis and a length M2 along the X-axis. The value of M2 with respect to the values of M and T shown in FIG. 4 is M2=M−T. To be more specific, T is set as 20 μm or greater. The rest of structure of the metal holder 17b is identical to that of the metal holder 17 according to the first embodiment of the present invention.

As shown in FIG. 12(b), when bonding one end of each optical component to the holders 70a, 70b, and 70c of the metal holder 17b, each optical component is bonded by shifting towards the root direction (towards the negative X-axis) of the metal holder 17b such that the region from the edge of each optical component up to the length T does not make a contact with the bonding surface S. Hence, a clearance U of length T is disposed between the optical components and the metal holder 17b.

Identical to the first embodiment of the present invention, a metalized layer 610 is provided on each optical component (the YVO$_4$ crystal 2, the LN crystal 3, and the polarizer 4b). The metalized layer 610 may be of the same dimensions as those of the bonding surface S of the projection 170 and may be placed at a position shifted by a non-bonded length T from the edge of each optical component, as shown in FIG. 12(b). A solder 611 is disposed between each optical component and the holders 70a, 70b and 70c of the metal holder 17b. The metal holder 17b is bonded to each optical component by heating the solder 611 in a reflow furnace.

Accordingly, identical to FIG. 9(a), the solder 611 is not bonded to the metal holder 17b from the edge of the optical components up to the non-bonded length T. Consequently, when the clearance U is offset from the edge by 20 μm or above, the whole region from the edge of the complex-refractive-index crystal up to the 20 μm or above becomes a non-bonded portion that is not bonded to the metal holder. As a result, even if fine cracks or distortions are present in the non-bonded portion, the heat stress does not have much of an effect. Thus, when the optical components are bonded to the metal holder, cracks in the optical components caused due to the heat stress can be effectively prevented.

A fourth embodiment of the present invention relates to another variation of the metal holder according to the first embodiment of the present invention.

FIG. 13(a) and FIG. 13(b) illustrate a structure of a metal holder 800 according to the fourth embodiment of the present invention. The reference numeral 801 indicates a holder that is provided on the side surface of the metal holder 800 and supports a wavelength filter 13. The reference numeral 801a indicates a bonding surface to which a YVO$_4$ crystal 2 provided on the holder 801 is bonded. The reference numeral 801b indicates a bonding surface to which a LN crystal 3 provided on the holder 801 is bonded. The reference numeral 802 indicates a holder that is provided on the bonding surface 802b and to which a polarizer 4 is bonded. The reference numeral 803 indicates a contact surface with which the YVO$_4$ crystal 2 makes contact. The reference numeral 804 indicates a protrusion provided on top of the metal holder 800. The reference numeral 805 indicates a protrusion that protrudes from the bottom of the metal holder 800 and constitutes the bottom surface of the metal holder 800.

The YVO$_4$ crystal 2 is bonded to the bonding surface 801a and the LN crystal 3 is bonded to the bonding surface 801b. The polarizer 4b is bonded to the bonding surface 802b in such a way that the polarizer 4b faces towards the LN crystal 3. The metal holder 800 supports the wavelength filter 13.

When the metal holder 800 is fixed inside an optical module, the bottom surface of the protrusion 805 is placed over a surface 16b of a carrier 16. The metal holder 800 is aligned by shifting it back and forth and sideways while holding the protrusion 804. After a contact with the attachment facets 32a and 33c shown in FIG. 1(d) has been established, the metal holder 800 is bonded to the carrier 16 by means of YAG welding. As the protrusion 805 makes contact over a large area, the holder metal holder 800 does not tip over easily and the alignment on the carrier 16 can be carried out easily.

The bonding surfaces 801a and 802b of the metal holder 800 can be processed simultaneously due to the protruded structure of the holders 801 and 802. As the protrusion 805 is also present, the cutter for cutting can be inserted from the top of the metal holder 800 (in an upward direction in FIG. 13(a)) and the protrusion can also be processed simultaneously. The YVO$_4$ crystal 2 and the polarizer 4b are bonded from the right side of FIG. 13(a), while the LN crystal is bonded from the left side of FIG. 12(a). As the directions from which these optical components are bonded are different, the optical components are placed upright and then soldered to the metal holder 800, as shown in FIG. 13(a). Though in the fourth embodiment of the present invention the workability or the assembling process may be inferior as compared to the first through third embodiments of the present invention, the alignment can be carried out easily.

According to the first through fourth embodiments of the present invention, a laser light output from a laser diode is passed through a wavelength filter, one end of which is bonded to a protrusion of a support material. By monitoring that transmitted light in a photodetector, there is less deterioration of the optical characteristics of the wavelength filter and the oscillation wavelength of the laser diode can be maintained at a stable level. The area required for placing the wavelength filter reduces by bonding the wavelength filter, which is fabricated from complex-refractive-index crystals and a polarizer 4b, to the support material, which includes plural protrusions. The area required for placing the wavelength filter and the PD device reduces by placing the wavelength filter between a first photodiode and a second photodiode, which measure the amount of the output light of the laser diode and the amount of the transmitted light of the wavelength filter, and the laser diode. Consequently, in addition to the wavelength filter or the PD device, it is possible to make a larger space available in order to fix other electronic components inside the optical module. The wavelength filter is bonded to the metal holder by leaving a gap between one side end of the wavelength filter and the metal holder. The wavelength filter is bonded to the metal support material by leaving a gap between one side end of the wavelength filter and the metal support material. Hence, when the complex-refractive-index crystals that constitute the wavelength filter is bonded to the metal support material, a bonding structure can be obtained in which cracks do not appear in the complex-refractive-index crystals and the complex-refractive-index crystals are not damaged.

INDUSTRIAL APPLICABILITY

The present invention is suitable for a wavelength filter, a wavelength monitor or an optical module equipped with a wavelength monitor of the semiconductor laser diode as a light source for wavelength division multiplexed (WDM) communications and dense wavelength division multiplexed (DWDM) communications using optical fibers. Furthermore, the present invention is suitable for a system requiring a high-precision wavelength monitoring of laser light without accompanying degradation or damage of optical characteristics caused by the effect of support structure or temperature variation.

The invention claimed is:

1. A wavelength monitor comprising:
   a laser diode;
   a photodetector that receives output light of the laser diode;
   a wavelength filter having a plurality of components, the wavelength filter disposed between the laser diode and the photodetector, the wavelength filter having an input surface and an output surface and a first side and a second side; and
   a support material that has at least one protrusion to which a part of any of the input surface or the output surface of the first side of the components of the wavelength filter is bonded.

2. The wavelength monitor according to claim 1, wherein the wavelength filter includes a complex-refractive-index crystal and a polarizer;
   the protrusion of the support material has a first protrusion to bond the complex-refractive-index crystal and a second protrusion to bond the polarizer.

3. The wavelength monitor according to claim 1, wherein the wavelength filter has a first complex-refractive-index crystal, a second complex-refractive-index crystal, and a polarizer, wherein the first complex-refractive-index crystal and the second complex-refractive-index crystal have different refractive indices;
   the protrusion of the support material has a first protrusion to bond the first complex-refractive index-crystal, a second protrusion to bond the second complex-refractive index-crystal, and a third protrusion to bond the polarizer; and
   signs of temperature-dependent change rate of refractive index difference between the direction of an optical axis and an orthogonal direction to the optical axis in both the first complex-refractive-index crystal and the second complex-refractive-index crystal are reversed.

4. The wavelength monitor according to claim 1, wherein the wavelength filter includes a $YVO_4$ crystal that is a complex-refractive-index crystal, a $LiNbO_3$ crystal that is a complex-refractive-index crystal, and a polarizer, and
   the protrusion includes a first protrusion to bond the $YVO_4$ crystal, a second protrusion to bond the $LiNbO_3$ crystal, and a third protrusion to bond the polarizer.

5. The wavelength monitor according to claim 2, wherein the photodetector includes a first photodiode and a second photodiode;
   the polarizer is disposed between the second photodiode and the complex-refractive-index crystal; and
   the polarizer is smaller than the complex-refractive-index crystal.

6. The wavelength monitor according to claim 5, wherein a cylinder-shaped lens is disposed between the laser diode and the wavelength filter such that a central axis of the lens is parallel to a direction in which the first photodiode and the second photodiode are aligned.

7. The wavelength monitor according to claim 5, wherein the wavelength monitor includes a photodiode mount;
   the first photodiode and the second photodiode are bonded on sides of the photodiode mount so that the receiving surfaces are in parallel each other.

8. The wavelength monitor according to claim 1, further comprising a carrier on which the laser diode, the support material, and the photodetector are fixed, wherein
   the support material having a top surface, a bottom surface, and a side surface, wherein the protrusion is provided on the side surface, and the bottom surface is bonded on the carrier; and
   the second side of the wavelength filter is not bonded to the support material.

9. The wavelength monitor according to claim 8, further comprising a power supply board provided on the carrier, wherein the power supply board is arranged at one side of the optical path of the laser diode and the photodetector and the power supply board supplies a current to drive the laser diode.

10. The wavelength monitor according to claim 9, supplies a bias current to the laser diode.

11. The wavelength monitor according to claim 10, further comprising a photodiode mount, wherein the photodetector is bonded on a side of the photodiode mount;
    the photodiode mount is placed on an upper surface of the carrier;
    the photodiode mount has a conductive layer on an upper surface;
    a connection strip line is provided on the photodiode mount; and
    the connection strip line connects the power supply board with a conductive plate that is arranged at the other side of the optical path of the laser diode and the photodetector.

12. The wavelength monitor according to claim 8, wherein
    the carrier has a first surface and a second surface, wherein the first surface is elevated with respect to the second surface;
    the laser diode is bonded on the first surface; and
    the support material is bonded on the second surface.

13. The wavelength monitor according to claim 2, wherein
    the support material is made of metal; and
    the support material and the wavelength filter are bonded by soldering or welding with low melting-point glass.

14. The wavelength monitor according to claim 1, wherein
    the support material is made of metal; and
    the support material and any one of the input surface and the output surface of the one end side of the wavelength filter are bonded having a non-bonding part from junction surface of the wavelength filter to the side end of the end side.

15. The wavelength monitor according to claim 14, wherein a bonding surface of the support material with the wavelength filter is stuck out of the protrusion to the bonding surface side.

16. The wavelength monitor according to claim 1, wherein
    the protrusion has a first bonding surface and a second bonding surface,
    the wavelength filter includes a first component and a second component, and
    the first component is bonded to the first surface and the second component is bonded to the second surface.

17. The wavelength monitor according to claim 1, wherein the support material has protusions to which a part of any of the input surface or the output surface of the first side of the components of the wavelength filter is bonded.

18. A wavelength monitor comprising:
    a laser diode;
    a first photodiode and a second photodiode that receive output light of the laser diode;

a complex-refractive-index crystal which includes a YVO$_4$ crystal and a LiNbO$_3$ crystal and which is disposed between the laser diode and the first photodiode and the second photodiode; and a polarizer disposed between the second photodiode and the complex-refractive-index crystal, wherein the polarizer is smaller than the complex-refractive-index crystal.

19. An optical module comprising:

the wavelength monitor according to claim 1, wherein the photo detector includes a first photodiode and a second photodiode;

a peltier that holds the wavelength monitor; and a control circuit that controls a temperature of the peltier based on outputs of the first photodiode and the second photodiode.

20. The wavelength monitor according to claim 17, wherein the support material has protusions to which a part of any of the input surface or the output surface of the first side of the components of the wavelength filter is bonded.

21. An optical module comprising:

the wavelength monitor according to claim 1, wherein an output light from one facet of the laser diode is incident on the wavelength filter;

a lens to guide an output light from an other facet of the laser diode to the outside;

a peltier that holds the wavelength monitor; and a package that houses the wavelength monitor, the lens, and the peltier.

22. The wavelength monitor according to claim 18, wherein the support material has protusions to which a part of any of the input surface or the output surface of the first side of the components of the wavelength filter is bonded.

23. An optical packaging method comprising the steps of:

placing a laser-diode-mounted board on a carrier;

placing a photodetector-mounted board on the carrier;

bonding a lens on the carrier;

bonding a part on one side of any one of an input surface and an output surface of components of a wavelength filter on at least one protusion of a support material; and bonding the support material on the carrier by placing the support material at a position where the support material makes a contact with a bonding surface provided on the carrier.

* * * * *